United States Patent
Jung et al.

(10) Patent No.: US 9,601,575 B2
(45) Date of Patent: Mar. 21, 2017

(54) SEMICONDUCTOR DEVICE HAVING ASYMMETRICAL SOURCE/DRAIN

(71) Applicants: Jongki Jung, Hwaseong-si (KR); Myungil Kang, Yongin-si (KR); Yoonhae Kim, Suwon-si (KR); Kwanheum Lee, Suwon-si (KR)

(72) Inventors: Jongki Jung, Hwaseong-si (KR); Myungil Kang, Yongin-si (KR); Yoonhae Kim, Suwon-si (KR); Kwanheum Lee, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/987,813

(22) Filed: Jan. 5, 2016

(65) Prior Publication Data

US 2016/0315146 A1    Oct. 27, 2016

(30) Foreign Application Priority Data

Apr. 23, 2015    (KR) ...................... 10-2015-0057193

(51) Int. Cl.

| | | |
|---|---|---|
| H01L 21/84 | (2006.01) | |
| H01L 29/08 | (2006.01) | |
| H01L 29/161 | (2006.01) | |
| H01L 29/16 | (2006.01) | |
| H01L 29/165 | (2006.01) | |
| H01L 29/78 | (2006.01) | |
| H01L 29/06 | (2006.01) | |

(52) U.S. Cl.
CPC ...... *H01L 29/0847* (2013.01); *H01L 29/0653* (2013.01); *H01L 29/161* (2013.01); *H01L 29/165* (2013.01); *H01L 29/1608* (2013.01); *H01L 29/7848* (2013.01); *H01L 29/7851* (2013.01)

(58) Field of Classification Search
CPC ......... H01L 21/823431; H01L 29/1054; H01L 29/0649; H01L 21/02532; H01L 27/0924; H01L 21/823412; H01L 21/02636; H01L 21/8256; H01L 27/0922; H01L 21/823821; H01L 21/845; H01L 29/7831; H01L 29/165; H01L 29/7848; H01L 21/723814; H01L 29/0843
See application file for complete search history.

(56) References Cited

U.S. PATENT DOCUMENTS

| | | |
|---|---|---|
| 8,198,673 B2 | 6/2012 | Yin et al. |
| 8,906,768 B2 | 12/2014 | Wong et al. |
| 2011/0193175 A1* | 8/2011 | Huang ............... H01L 21/82343 257/386 |
| 2011/0210404 A1* | 9/2011 | Su .......................... H01L 29/785 257/401 |

(Continued)

*Primary Examiner* — Jarrett Stark
*Assistant Examiner* — Bitew Dinke
(74) *Attorney, Agent, or Firm* — Myers Bigel, P.A.

(57) ABSTRACT

A semiconductor device includes a substrate, an active fin protruding from the substrate, and an asymmetric diamond-shaped source/drain disposed on an upper surface of the active fin. The source/drain includes a first crystal growth portion and a second crystal growth portion sharing a plane with the first crystal growth portion and having a lower surface disposed at a lower level than a lower surface of the first crystal growth portion.

20 Claims, 31 Drawing Sheets

(56) References Cited

U.S. PATENT DOCUMENTS

| | | | |
|---|---|---|---|
| 2013/0043536 A1* | 2/2013 | Rahim | H01L 29/66795 257/347 |
| 2013/0168701 A1 | 7/2013 | Kiyosawa et al. | |
| 2013/0256767 A1* | 10/2013 | Pradhan | H01L 29/78 257/288 |
| 2014/0183605 A1* | 7/2014 | Mochizuki | H01L 29/785 257/288 |
| 2014/0203338 A1 | 7/2014 | Kelly et al. | |
| 2014/0217517 A1 | 8/2014 | Cai et al. | |
| 2014/0246710 A1 | 9/2014 | Tsai et al. | |
| 2014/0252477 A1* | 9/2014 | Tseng | H01L 29/66795 257/347 |
| 2014/0264636 A1 | 9/2014 | Tsai et al. | |
| 2014/0299934 A1* | 10/2014 | Kim | H01L 29/7848 257/347 |
| 2014/0374827 A1* | 12/2014 | Suh | H01L 29/785 257/347 |
| 2015/0255604 A1* | 9/2015 | Yang | H01L 29/7848 257/192 |
| 2015/0318399 A1* | 11/2015 | Jeong | H01L 29/7853 257/401 |
| 2016/0087063 A1* | 3/2016 | Yin | H01L 29/4916 257/344 |
| 2016/0087099 A1* | 3/2016 | Moroz | H01L 29/66795 257/190 |
| 2016/0111339 A1* | 4/2016 | Zang | H01L 21/82381 257/369 |
| 2016/0126093 A1* | 5/2016 | Dube | H01L 21/02532 438/481 |
| 2016/0155845 A1* | 6/2016 | Breil | H01L 29/7843 257/347 |
| 2016/0211352 A1* | 7/2016 | Chuang | H01L 29/66795 |

* cited by examiner

SEMICONDUCTOR DEVICE HAVING ASYMMETRICAL SOURCE/DRAIN

CROSS-REFERENCE TO RELATED APPLICATION

This application claims priority under 35 U.S.C. §119 to Korean Patent Application No. 10-2015-0057193 filed on Apr. 23, 2015, the disclosure of which is hereby incorporated by reference in its entirety.

BACKGROUND

Recently, semiconductor chips installed in mobile products have tended to be extremely miniaturized and highly integrated, and accordingly semiconductor devices have become small.

As semiconductor devices integrated in semiconductor chips are downsized, contact areas of crystal growth source/drains are decreased and on-current characteristics of the semiconductor devices are degraded. Various methods to solve such problems have been suggested.

SUMMARY

Embodiments of the inventive concept provide a semiconductor device in which a contact area of a source/drain is further secured by growing the source/drain having an asymmetric shape.

Other embodiments of the inventive concept provide a method of forming a semiconductor device that is advantageous for high integration and has excellent electrical properties.

The technical objectives of the inventive concept are not limited to the above disclosure; other objectives may become apparent to those of ordinary skill in the art based on the following descriptions.

In accordance with an aspect of the inventive concept, a semiconductor device includes a substrate, an active fin protruding from the substrate, and an asymmetric diamond-shaped source/drain disposed on an upper surface of the active fin. The source/drain includes a first crystal growth portion and a second crystal growth portion sharing a plane with the first crystal growth portion and having a lower surface disposed at a lower level than a lower surface of the first crystal growth portion.

The first crystal growth portion may be in contact with the upper surface of the active fin, and the second crystal growth portion may be in contact with a side surface of the active fin. The second crystal growth portion may share the plane with the first crystal growth portion and have a rectangular shape.

In accordance with another aspect of the inventive concept, a semiconductor device includes a substrate, active fins protruding from the substrate, a device isolation layer filling between the active fins, and asymmetrical source/drains formed on the active fins. Upper surfaces of the device isolation layer adjacent to side surfaces of the active fins are disposed at a relatively low level, and upper surfaces of the device isolation layer adjacent to the other side surfaces parallel to the side surfaces are disposed at a relatively high level. The source/drains include first crystal growth portions contacting upper surfaces of the active fins and the upper surfaces of the device isolation layer disposed at the relatively high level, and second crystal growth portions sharing planes with the first crystal growth portions and contacting side surfaces of the active fins and the upper surfaces of the device isolation layer disposed at the relatively low level.

The upper surfaces of the device isolation layer adjacent to facing side surfaces of adjacent active fins may be disposed at the same level. The semiconductor device may further include gate stacks crossing the active fins. Each of the gate stacks may include a gate dielectric layer and a gate electrode. The gate dielectric layer may include a lower surface contacting the upper surfaces of the device isolation layer and the upper surfaces of the active fins, and side surfaces perpendicular to the lower surface. The gate electrode may be in contact with the lower surface and the side surfaces of the gate dielectric layer.

The semiconductor device may further include a first trench shared by the active fins and having a first width, and a second trench having a second width greater than the first width. Side surfaces of the first trench and side surfaces of the second trench may be the side surfaces of the active fins. The device isolation layer may fill the first trench and the second trench, and the upper surface of the device isolation layer adjacent to the side surfaces of the first trench may be disposed at a higher level than the upper surface of the device isolation layer adjacent to the side surfaces of the second trench.

In accordance with still another aspect of the inventive concept, a semiconductor device includes a substrate, active fins protruding from the substrate and including first fin areas and recessed second fin areas, gate stacks crossing the first fin areas, spacers on side surfaces of the gate stacks, a device isolation layer covering lower portions of the active fins, and asymmetrical source/drains on the second fin areas. Each source/drain includes a first crystal growth portion and a second crystal growth portion sharing a plane with the first crystal growth portion and having a lower surface disposed at a lower level than a lower surface of the first crystal growth portion.

The semiconductor device may further include a first residue between the first crystal growth portion and the device isolation layer and a second residue between the second crystal growth portion and the device isolation layer. The first residue and the second residue may include the same material as the spacers. An upper surface of the first residue may be disposed at the same level as or a higher level than upper surfaces of the active fins, and an upper surface of the second residue may be disposed at a lower level than the upper surface of the first residue.

An upper surface of the device isolation layer in contact with the first residue and an upper surface of the device isolation layer in contact with the second residue may be disposed at the same level. Each recessed second fin area may include a recessed upper surface and a recessed side surface perpendicular to the recessed upper surface. The first crystal growth portion of each source/drain may be in contact with the recessed upper surface and the recessed side surface of each recessed second fin area. The semiconductor device may further include source/drain contacts in contact with the source/drains. The semiconductor device may further include silicide layers disposed between the source/drains and the source/drain contacts.

In accordance with still another aspect of the inventive concept, a semiconductor device includes a substrate, active fins protruding from the substrate, and a source/drain contacting the active fins at the same time and having a merged shape. The source/drain includes first crystal growth portions contacting upper surfaces of the active fins, second crystal growth portions sharing planes with the first crystal growth portions and contacting side surfaces of the active fins, and a third crystal growth portion formed in such a manner that adjacent edges of the first crystal growth portions are merged.

Some embodiments of the present inventive concept are directed to a semiconductor device, including a substrate, an active fin protruding from the substrate and a diamond-shaped source/drain disposed on an upper surface of the active fin. The diamond-shaped source/drain may include a first crystal growth portion and a second crystal growth portion. The second crystal growth portion may include a lower surface disposed at a lower level than a lower surface of the first crystal growth portion.

In some embodiments, the semiconductor device may include a device isolation region adjacent the active fin, a first residue disposed between the first crystal growth portion of the active fin and the device isolation layer, and a second residue disposed between the second crystal growth portion of the active fin and the device isolation layer. An upper surface of the first residue may be disposed at the same level as or at a higher level than an upper surface of the active fin. An upper surface of the second residue may be disposed at a lower level than the upper surface of the first residue and/or the active fin.

In some embodiments, the active fin may be a first active fin, and the diamond-shaped source/drain may be a first diamond-shaped source/drain. The semiconductor device may further include a second active fin protruding from the substrate and spaced apart from the first active fin by the device isolation layer, a second diamond-shaped source/drain disposed on an upper surface of the second active fin, the second diamond-shaped source/drain including a third crystal growth portion and a fourth crystal growth portion. The fourth crystal growth portion may include a lower surface disposed at a lower level than a lower surface of the third crystal growth portion. A merging crystal growth may connect the first crystal grown portion of the first diamond-shaped source/drain and the third crystal growth portion of the second diamond-shaped source/drain. In some embodiments the merging crystal growth may be remote from the second crystal growth portion of the first diamond-shaped source/drain, and the merging crystal growth may be remote from the fourth crystal growth portion of the second diamond-shaped source/drain. The dopant concentration of the first diamond-shaped source/drain may gradually increase towards an upper end of the first diamond-shaped source/drain.

In some embodiments, the semiconductor device may include a gate stack including a gate dielectric layer and a gate electrode, a spacer electrically isolating the gate stack from the first diamond-shaped source/drain and the second diamond-shaped source/drain; a contact electrode adjacent the spacer. The contact electrode may be in direct contact with the first diamond-shaped source/drain, the second diamond-shaped source/drain, and the merging crystal growth.

It is noted that aspects of the disclosure described with respect to one embodiment, may be incorporated in a different embodiment although not specifically described relative thereto. That is, all embodiments and/or features of any embodiment may be combined in any way and/or combination. These and other objects and/or aspects of the present invention are explained in detail in the specification set forth below.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings:

FIG. 1A is an enlarged view of E1 of FIG. 1A. FIG. 1D is an enlarged view of E1$a$ of FIG. 1D;

FIG. 2 is an enlarged view of E2$a$ in FIG. 2;

FIG. 14 is an enlarged view of E5 in FIG. 14, FIG. 15 is an enlarged view of E6 in FIG. 15, and FIG. 16 is an enlarged view of E2 in FIG. 16;

DETAILED DESCRIPTION

Figure 1A:
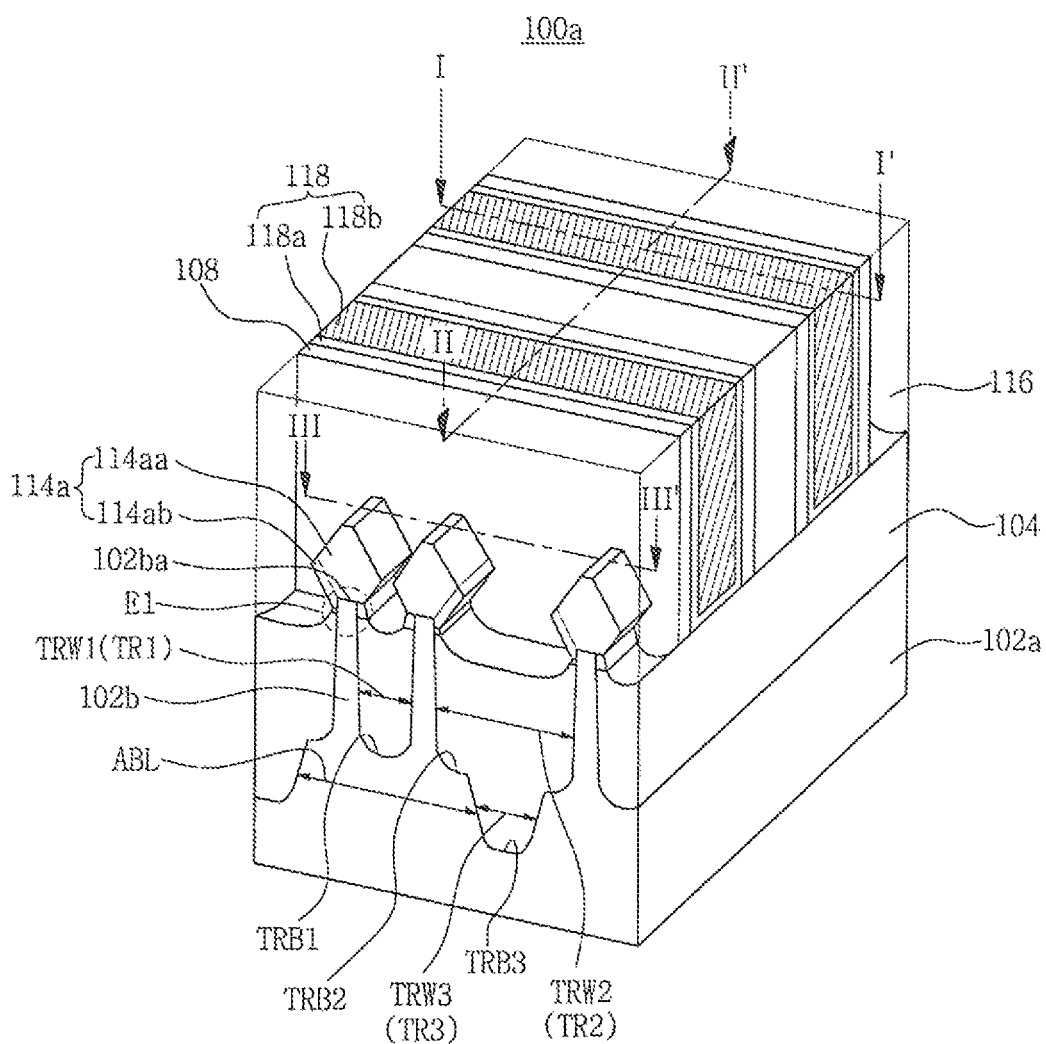
FIG. 1A is a perspective view illustrating a semiconductor device in accordance with an embodiment of the inventive concept.
Figure 1A:
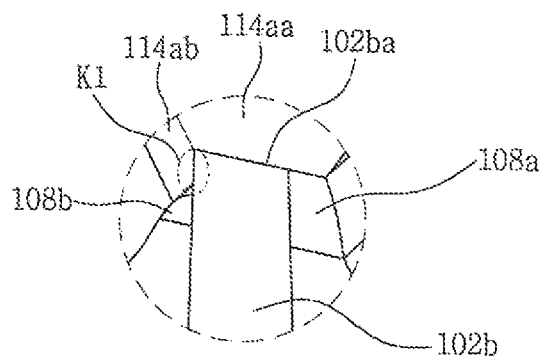

Advantages and features of the inventive concept and methods of accomplishing them will be made apparent with reference to the accompanying drawings and some embodiments to be described below. These inventive concepts may, however, be embodied in different forms and should not be construed as limited to the embodiments set forth herein. Rather, these embodiments are provided so that this disclosure is thorough and complete and fully conveys the inventive concept to those skilled in the art. Accordingly, all such modifications are intended to be included within the scope of this inventive concept as defined in the claims.

The terminology used herein to describe embodiments of the invention is not intended to limit the scope of the invention. The use of the singular form in the present document should not preclude the presence of more than one referent. In other words, elements of the invention referred to in the singular form may number one or more, unless the context clearly indicates otherwise. It will be further understood that the terms "comprises," "comprising," "includes," and/or "including," when used herein, specify the presence of stated elements, components, steps, operations, and/or devices, but do not preclude the presence or addition of one or more other elements, components, steps, operations, and/or devices.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of the present inventive concept.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

As semiconductor devices sizes are further reduced, conventional contact areas of source drain regions are decreased and on-current characteristics of semiconductor devices are degraded. The present inventive concept arises from the recognition that the contact area of a crystal growth source/drain needs to be increased for improved on-current characteristics. This may be achieved by use of a left-right asymmetric diamond shaped source/drain, as will be described now in further detail.

Figure 1B:
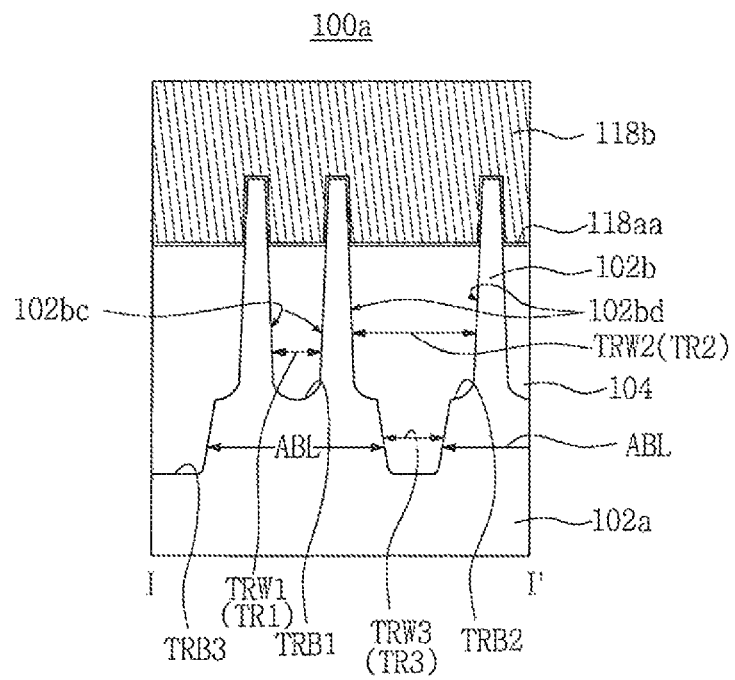
FIG. 1B is a cross-sectional view taken along line I-I' of FIG. 1A.
Figure 1C:
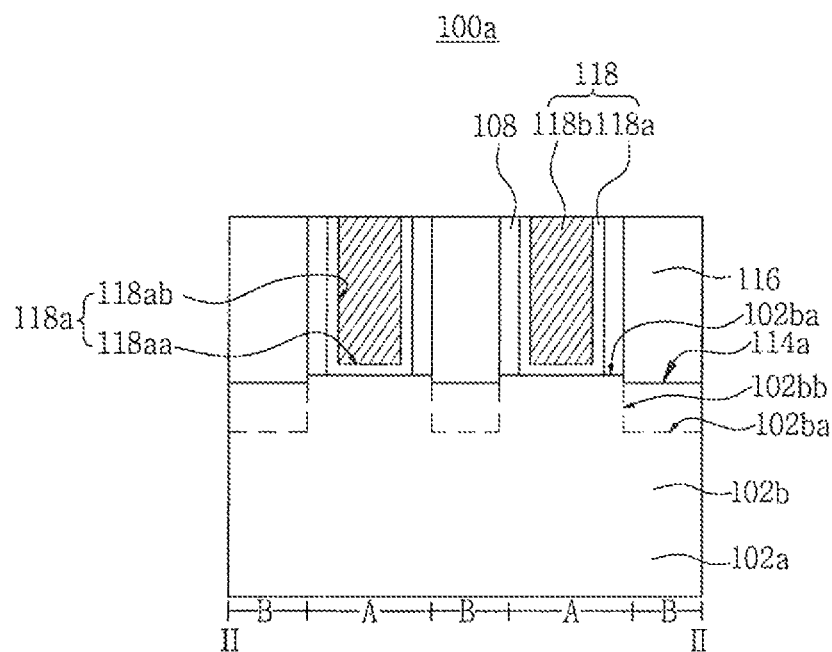
FIG. 1C is a cross-sectional view taken along line II-II' of FIG. 1A.
Figure 1D:
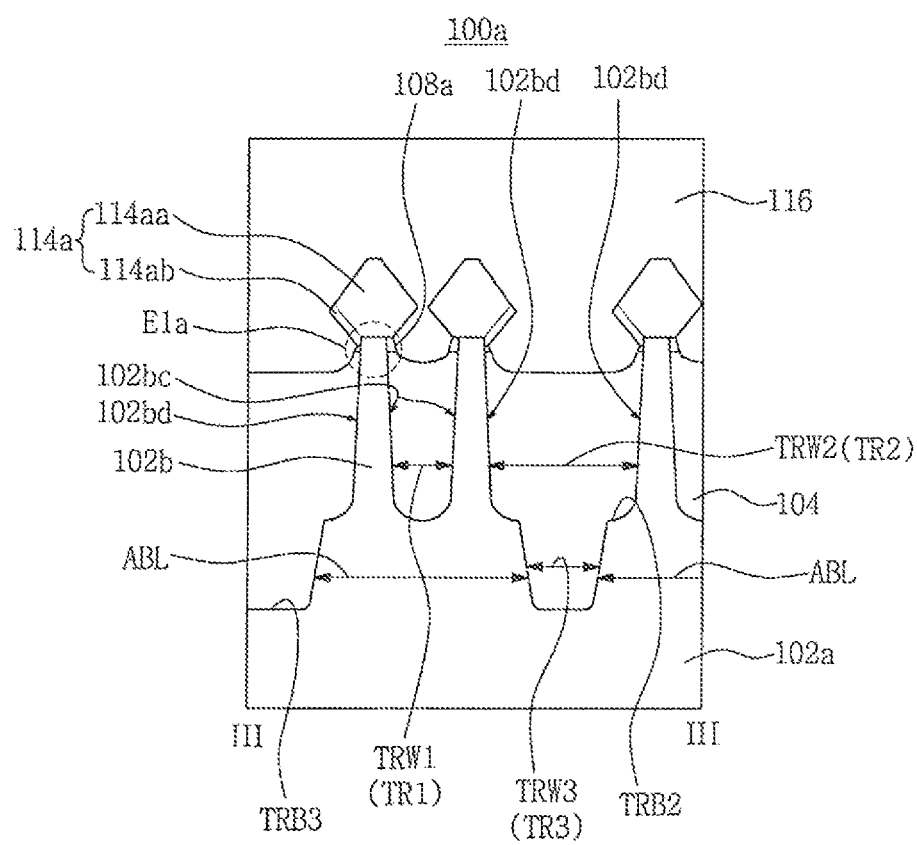
FIG. 1D is a cross-sectional view taken along line of FIG. 1A.
Figure 1D:
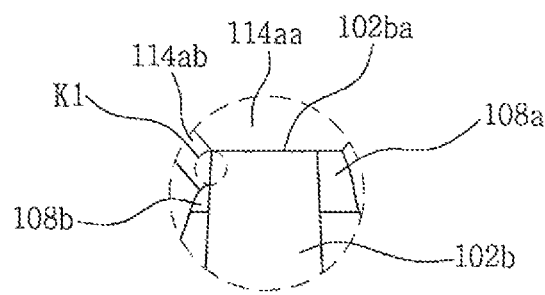

FIG. 1A is a perspective view illustrating a semiconductor device in accordance with an embodiment of the inventive concept. FIG. 1A is an enlarged view of E1 of FIG. 1A. FIG. 1B is a cross-sectional view taken along line I-I' of FIG. 1A. FIG. 1C is a cross-sectional view taken along line II-II' of FIG. 1A. FIG. 1D is a cross-sectional view taken along line of FIG. 1A, and FIG. 1D is an enlarged view of E1a of FIG. 1D.

Referring to FIGS. 1A, 1B, and 1C, a semiconductor device 100a in accordance with an embodiment of the inventive concept may include a substrate 102a, active fins 102b protruding from a surface of the substrate 102a, a device isolation layer 104, gate stacks 118, spacers 108, crystal growth source/drains 114a having an asymmetrical shape, and an interlayer insulating layer 116.

The substrate 102a may include the protruding active fins 102b, first trenches TR1, second trenches TR2, and third trenches TR3. The first trenches TR1 and the second trenches TR2 may be formed when the substrate 102a is recessed to form the active fins 102b. Side surfaces of the first trenches TR1 and the second trenches TR2 may be side surfaces of the active fins 102b. Widths TRW1 of the first trenches TR1 and widths TRW2 of the second trenches TR2 may be interpreted as distances between adjacent active fins 102b. The widths TRW1 of the first trenches TR1 may be smaller than the widths TRW2 of the second trenches TR2.

Accordingly, distances between the active fins 102b sharing the first trenches TR1 may be smaller than distances between the active fins 102b sharing the second trenches TR2. The third trenches TR3 may be formed by recessing bottom surfaces TRB2 of the second trenches TR2. Bottom surfaces TRB1 of the first trenches TR1 may be disposed at the same level as the bottom surfaces TRB2 of the second trenches TR2. Bottom surfaces TRB3 of the third trenches TR3 may be disposed at a lower level (i.e. deeper into the substrate 102a) than the bottom surfaces TRB1 of the first trenches TR1 and the bottom surfaces TRB2 of the second trenches TR2.

Active blocks ABL may be separated by the second trenches TR2 and/or third trenches TR3. Each active block ABL may include the active fins 102b sharing the first trench TR1. For example, an SRAM may include the active blocks ABL having different-type impurities. The third trenches TR3 may electrically insulate the active blocks ABL.

The active fins 102b may be spaced apart from each other and may extend in a direction away from the substrate 102a.

The active fins 102b, referring to FIG. 1C, may include first fin areas A and second fin areas B. The second fin areas B may be recessed areas and may include recessed upper surfaces 102ba and recessed side surfaces 102bb. The recessed upper surfaces 102ba of the second fin areas B may be disposed at a lower level than upper surfaces 102ba' of the first fin areas A. Accordingly, the active fins 102b may have a concave-convex shape including concave portions and convex portions. The substrate 102a may include a silicon (Si) substrate and a silicon-germanium (SiGe) substrate.

The device isolation layer 104, referring to FIG. 1A, may fill the first trenches TR1, the second trenches TR2, and the third trenches TR3. An upper surface of the device isolation layer 104 may be disposed at a lower level than the recessed upper surfaces 102ba of the active fins 102b. The upper surface of the device isolation layer 104 filling the first trenches TR1 may be disposed at a higher level than the upper surface of the device isolation layer 104 filling the second trenches TR2. The device isolation layer 104 may include silicon oxide ($SiO_2$).

First residues 108a may remain on first side surfaces 102bc of the active fins 102b sharing the first trenches TR1, and second residues 108b may remain on second side surfaces 102bd of the active fins 102b sharing the second trenches TR2 and parallel to the first side surfaces 102bc. The first residues 108a and the second residues 108b may be in contact with upper surfaces of the device isolation layer 104 filling the first trenches TR1 and the second trenches TR2. The upper surfaces of the device isolation layer 104 contacting the first residues 108a and the second residues 108b may be disposed at the same level. The second residues 108b may be smaller in volume than the first residues 108a. Upper surfaces of the first residues 108a may be disposed at a higher level than upper surfaces of the second residues 108b. The second side surfaces 102bd of the active fins 102b may include exposed portions K1. The exposed portions K1 may be portions exposed by level differences between the recessed upper surfaces 102ba of the active fins 102b and the upper surfaces of the second residues 108b.

The gate stacks 118 may have a bar shape extending in a direction. The gate stacks 118 may be spaced apart from each other and cross the active fins 102b. The gate stacks 118 may perpendicularly cross the second fin areas B of the active fins 102b. The gate stacks 118 may include gate dielectric layers 118a and gate electrodes 118b. The gate dielectric layers 118a may include lower surfaces 118aa conformally formed on the upper surfaces of the device isolation layer 104 and the upper and side surfaces of the active fins 102*b* of the second fin areas B, and side surfaces 118*ab* perpendicular to the lower surfaces 118*aa*. The gate electrodes 118*b* may be in contact with the lower surfaces 118*aa* and the side surfaces 118*ab* of the gate dielectric layers 118*a* and may fill spaces formed by the gate dielectric layers 118*a*. The gate dielectric layers 118*a* may include a high-k dielectric material. More specifically, the high-k dielectric material may include hafnium oxide (HfO$_2$), aluminum oxide (Al$_2$O$_3$), zirconium oxide (ZrO$_2$), or tantalum oxide (Ta$_2$O$_5$). The gate electrodes 118*b* may include tungsten (W) or aluminum (Al). In some embodiments, the gate electrodes 118*b* may have a stacked structure including barrier layers.

The spacers 108 may be in contact with the side surfaces 118*ab* of the gate dielectric layers 118*a*. The spacers 108 may be formed in a multilayer. The spacers 108 may include stacked silicon nitride (SiN$_x$) and silicon carbide (SiC) layers. In some embodiments, the spacers 108 may include stacked silicon nitride (SiN$_x$) and silicon carbonitride (SiCN) layers. The first residues 108*a* and the second residues 108*b* may include the same material as the spacers 108. More specifically, the first residues 108*a* and the second residues 108*b* may be residues of the spacers 108 that remain without being removed.

The source/drains 114*a* may have a left-right asymmetric diamond shape. Each source/drain 114*a* may include a first crystal growth portion 114*aa* and a second crystal growth portion 114*ab*. For convenience of description, the first crystal growth portion 114*aa* may be referred to as "a main growth portion," and the second crystal growth portion 114*ab* may be referred to as "an additional growth portion."

The main growth portion 114*aa* may be a portion grown from the recessed upper surface 102*ba* and the recessed side surface 102*bb* of the active fin 102*b*. The additional growth portion 114*ab* may be a portion grown from the exposed portion K1 of the second side surface 102*bd* of the active fin 102*b*. The main growth portion 114*aa* may have a left-right symmetric diamond shape, and the additional growth portion 114*ab* may have a rectangular shape. The additional growth portion 114*ab* and the main growth portion 114*aa* may share a plane.

A lower surface of the main growth portion 114*aa* may be in contact with the recessed upper surface 102*ba* of the active fin 102*b* and the upper surface of the first residue 108*a*, and a lower surface of the additional growth portion 114*ab* may be in contact with the exposed portion K1 of the second side surface 102*bd* of the active fin 102*b* and the upper surface of the second residue 108*b*. The lower surface of the additional growth portion 114*ab* may be disposed at a lower level than the lower surface of the main growth portion 114*aa*.

The source/drains 114*a* may be grown in an epitaxial growth process. The source/drains 114*a* may include Si, SiGe, or SiC. The source/drains 114*a* may include impurities. When the semiconductor device 100*a* is an N-type transistor, it may include N-type impurities. When the semiconductor device 100*a* is a P-type transistor, it may include P-type impurities. The impurities may be included throughout the source/drains 114*a* and the active fins 102*b* thereunder. The impurities may be distributed differently in the source/drains 114*a*. For example, the dopant concentration may gradually increase toward upper ends of the source/drains 114*a*.

The interlayer insulating layer 116 may cover the source/drains 114*a*. An upper surface of the interlayer insulating layer 116 may be disposed at the same level as upper surfaces of the gate stacks 118.

Figure 2:
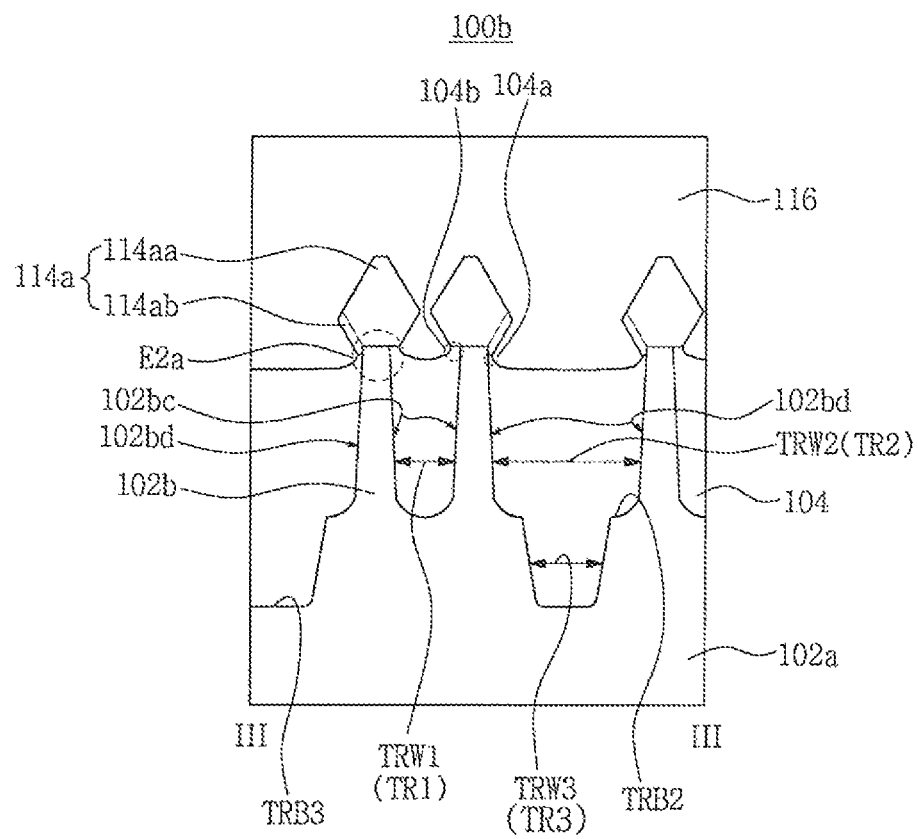
FIG. 2 is a cross-sectional view for describing a semiconductor device in accordance with embodiments of the inventive concept.
Figure 2:
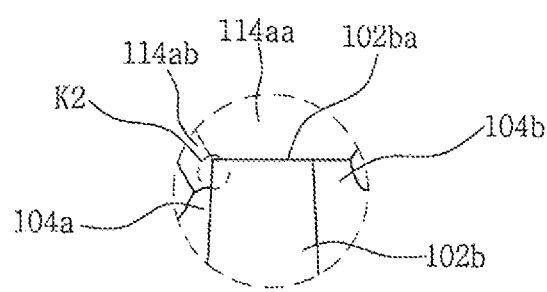

FIG. 2 is a cross-sectional view for describing a semiconductor device in accordance with embodiments of the inventive concept. FIG. 2 is an enlarged view of E2*a* in FIG. 2. The configuration described with reference to FIG. 2 may be understood as an embodiment of the configuration described with reference to FIG. 1D.

Referring to FIG. 2, a semiconductor device 100*b* may include a substrate 102*a*, active fins 102*b*, crystal growth source/drains 114*a* having a left-right asymmetric diamond shape, and a device isolation layer 104.

The device isolation layer 104 may fill the first trenches TR1, the second trenches TR2, and the third trenches TR3 described above with reference to FIGS. 1A to 1D.

An upper surface of the device isolation layer 104 filling the first and second trenches TR1 and TR2 may be disposed at a high level and a low level. The high level may have the highest value among levels of the upper surface of device isolation layer 104, and the low level may have the lowest value among the levels of the upper surface of device isolation layer 104. The upper surface at the high level may be located adjacent to side surfaces of the active fins 102*b*. Such a level difference in the upper surface of the device isolation layer 104 may be determined by widths TRW1 and TRW2 of the first and second trenches TR1 and TR2 shared by the active fins 102*b*, that is, distances between the active fins 102*b*. As the widths TRW1 and TRW2 of the first and second trenches TR1 and TR2 decrease, the level difference in the upper surface of the device isolation layer 104 may significantly increase. Here, since a portion disposed at the high level protrudes than a portion disposed at the low level, it is referred to as a "protrusion" hereinafter.

Accordingly, the device isolation layer 104 filling the first trenches TR1 may include first protrusions 104*a* protruding from side surfaces of the first trenches TR1. The device isolation layer 104 filling the second trenches TR2 may include second protrusions 104*b* protruding from side surfaces of the second trenches TR2. Upper surfaces of the first protrusions 104*a* may be disposed at a higher level than upper surfaces of the second protrusions 104*b*. The upper surfaces of the first protrusions 104*a* may be disposed at the same level as or a higher level than the upper surfaces of the active fins 102*b*. Second side surfaces 102*bd* of the active fins 102*b* may include exposed portions K2.

The exposed portions K2 may be portions exposed by level differences between recessed upper surfaces 102*ba* of the active fins 102*b* and the upper surfaces of the second protrusions 104*b*.

The crystal growth source/drains 114*a* may include main growth portions 114*aa* and additional growth portions 114*ab*. Lower surfaces of the main growth portions 114*aa* may be in contact with the upper surfaces of the active fins 102*b* and the upper surfaces of the first protrusions 104*a*. Lower surfaces of the additional growth portions 114*ab* may be in contact with the exposed portions K2 of the second side surfaces 102*bd* of the active fins 102*b* and the upper surfaces of the second protrusions 104*b*. The lower surfaces of the additional growth portions 114*ab* may be disposed at a lower level than the lower surfaces of the main growth portions 114*aa*.

Figure 3A:
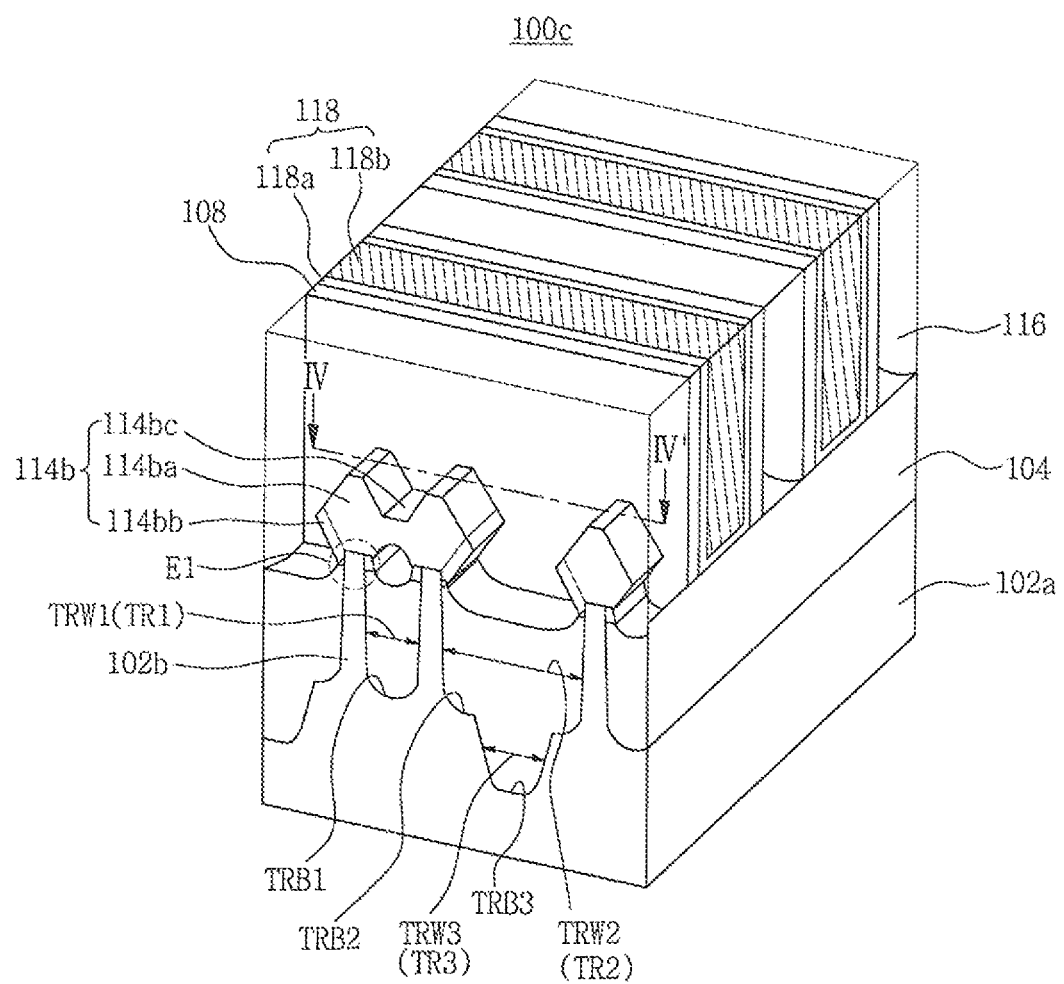
FIG. 3A is a perspective view illustrating a semiconductor device in accordance with embodiments of the inventive concept.
Figure 3B:
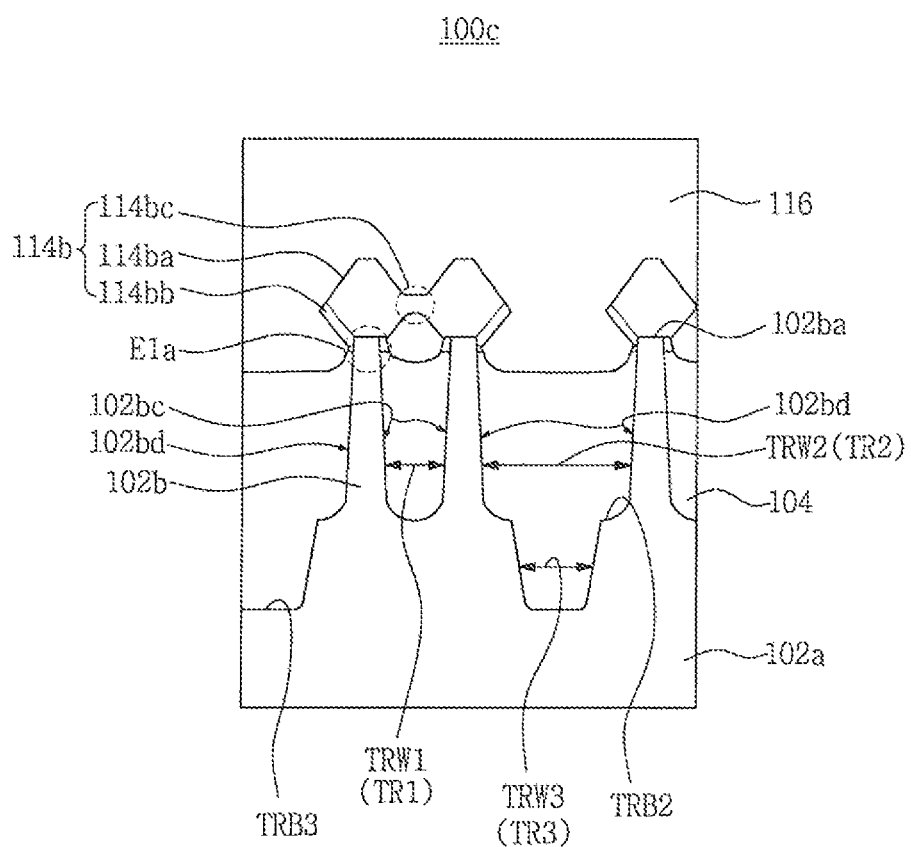
FIG. 3B is a cross-sectional view taken along line IV-IV' of FIG. 3A.

FIG. 3A is a perspective view illustrating a semiconductor device in accordance with embodiments of the inventive concept. FIG. 3B is a cross-sectional view taken along line IV-IV' of FIG. 3A.

In the configuration of FIG. 3A, the same reference numerals as those in FIG. 1 may denote the same components as those in FIG. 1, and detailed descriptions thereof will be omitted. Since E1 of FIG. 3A and E1a of FIG. 3B have the same configurations as FIG. 1A and FIG. 1D, respectively, these figures may be referred to.

Referring to FIGS. 3A, 3B, 1A, 1C, and 1D, a semiconductor device 100c in accordance with embodiments of the inventive concept may include a substrate 102a, active fins 102b protruding from a surface of the substrate 102a, a device isolation layer 104, gate stacks 118, spacers 108, merged crystal growth source/drains 114b, and an interlayer insulating layer 116.

The substrate 102a may include the protruding active fins 102b, first trenches TR1, second trenches TR2, and third trenches TR3. Side surfaces of the first trenches TR1 may be first side surfaces 102bc of adjacent active fins 102b, and side surfaces of the second trenches TR2 may be second side surfaces 102bd parallel to the first side surfaces 102bc of the active fins 102b.

First residues 108a may remain on the first side surfaces 102bc of the active fins 102b, and second residues 108b may remain on the second side surfaces 102bd of the active fins 102b. Upper surfaces of the first residues 108a may be disposed at the same level as or a higher level than upper surfaces of the active fins 102b. Upper surfaces of the second residues 108b may be disposed at a lower level than the upper surfaces of the first residues 108a. The second side surfaces 102bd of the active fins 102b may include exposed portions K1. The exposed portions K1 may be portions exposed by level differences between recessed upper surfaces 102ba of the active fins 102b and the upper surfaces of the second residues 108b. The first residues 108a and the second residues 108b may include the same material as the spacers 108.

The merged source/drains 114b may be in contact with a plurality of active fins 102b, and may include first crystal growth portions 114ba, second crystal growth portions 114bb, and third crystal growth portions 114bc. For convenience of description, the first crystal growth portion 114ba may be referred to as "a main growth portion," the second crystal growth portion 114bb may be referred to as "an additional growth portion," and the third crystal growth portions 114bc may be referred to as "a merged growth portion."

The main growth portions 114ba may be portions grown from the recessed upper surfaces 102ba and recessed side surfaces 102bb of the active fins 102b. The additional growth portions 114bb may be portions grown from the exposed portions K1 of the second side surfaces 102bd of the active fins 102b. The additional growth portions 114bb may be respectively located at one side and the other side of the merged source/drains 114b. Each main growth portion 114aa may share a plane with each additional growth portion 114bb. The main growth portions 114ba may have a diamond shape, the additional growth portions 114bb may have a rectangular shape, and the merged growth portions 114bc may be understood as having a shape in which edges of the main growth portions 114ba are merged. More specifically, the merged growth portions 114bc may be portions in which adjacent edges of the main growth portions 114ba are merged and the merged portions are extended upwardly and downwardly during a crystal growth process.

Lower surfaces of the main growth portions 114ba may be in contact with the upper surfaces of the active fins 102b and the upper surfaces of the first residues 108a, and lower surfaces of the additional growth portions 114bb may be in contact with the side surfaces of the active fins 102b and the upper surfaces of the second residues 108b. The lower surfaces of the additional growth portions 114bb may be disposed at a lower level than the lower surfaces of the main growth portions 114ba. Lower surfaces of the merged growth portions 114bc may be disposed at a higher level than the lower surfaces of the main growth portions 114ba.

Figure 4:
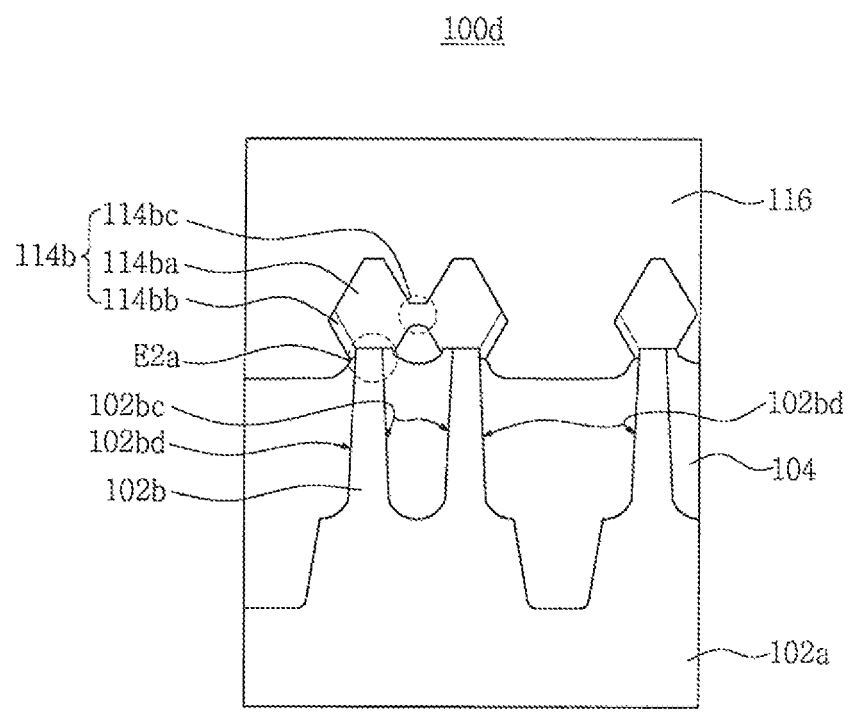
FIG. 4 is a cross-sectional view taken along line IV-IV' of FIG. 3A for describing a semiconductor device in accordance with embodiments of the inventive concept.

FIG. 4 is a cross-sectional view for describing a semiconductor device in accordance with embodiments of the inventive concept. FIG. 4 may be understood as an embodiment of the configuration described with reference to FIG. 3B. Since E2a of FIG. 4 has the same configuration as FIG. 2, this figure may be referred to.

Referring to FIGS. 4 and 2, a semiconductor device 100d in accordance with the embodiment of the inventive concept may include a substrate 102a, active fins 102b, merged crystal growth source/drains 114b, and a device isolation layer 104.

The device isolation layer 104 may fill the above-described first trenches TR1, second trenches TR2, and third trenches TR3. An upper surface of the device isolation layer 104 filling the first trenches TR1 may be disposed at a higher level than an upper surface of the device isolation layer 104 filling the second trenches TR2. The upper surface of the device isolation layer 104 filling the first trenches TR1 may be disposed at a high level and a low level. Since a portion disposed at the high level protrudes more than a portion disposed at the low level, it is referred to as a "protrusion" hereinafter.

Accordingly, the device isolation layer 104 filling the first trenches TR1 may include first protrusions 104a protruding from side surfaces of the first trenches TR1. The device isolation layer 104 filling the second trenches TR2 may include second protrusions 104b protruding from side surfaces of the second trenches TR2. Upper surfaces of the first protrusions 104a may be disposed at a higher level than upper surfaces of the second protrusions 104b. Second side surfaces 102bd of the active fins 102b may include exposed portions K2. The exposed portions K2 may be portions exposed by level differences between recessed upper surfaces of the active fins 102b and the upper surfaces of the second protrusions 104b.

The merged crystal growth source/drains 114b may have a shape in which edges of crystal growth portions having an asymmetric diamond shape are merged, as described above. The merged source/drains 114b may include main growth portions 114ba, additional growth portions 114bb, and merged growth portions 114bc.

Lower surfaces of the main growth portions 114ba may be in contact with the upper surfaces of the active fins 102b and upper surfaces of the first protrusions 104a, and lower surfaces of the additional growth portions 114bb may be in contact with the exposed portions K2 of the second side surfaces 102bd of the active fins 102b and the upper surfaces of the second protrusions 104b. The lower surfaces of the additional growth portions 114bb may be disposed at a lower level than the lower surfaces of the main growth portions 114ba. Lower surfaces of the merged growth portions 114bc may be disposed at a higher level than the lower surfaces of the main growth portions 114ba.

FIGS. 5A, 6A, 7A, 8A, 9A, 10A, 11A, 12, and 13A are process perspective views illustrating a method of fabricating a semiconductor device in accordance with an embodiment of the inventive concept according to a process sequence. FIGS. 5B, 6B, 7B, 8B, 9B, 10B, 11B, 12B, and 13B are cross-sectional views taken along lines V-V' of the perspective views, respectively (here, the line V-V' will be omitted in FIG. 6A, 7A, 8A, and FIGS. 9A, 10A, 11A, 12, and 13A).

Figure 5A:
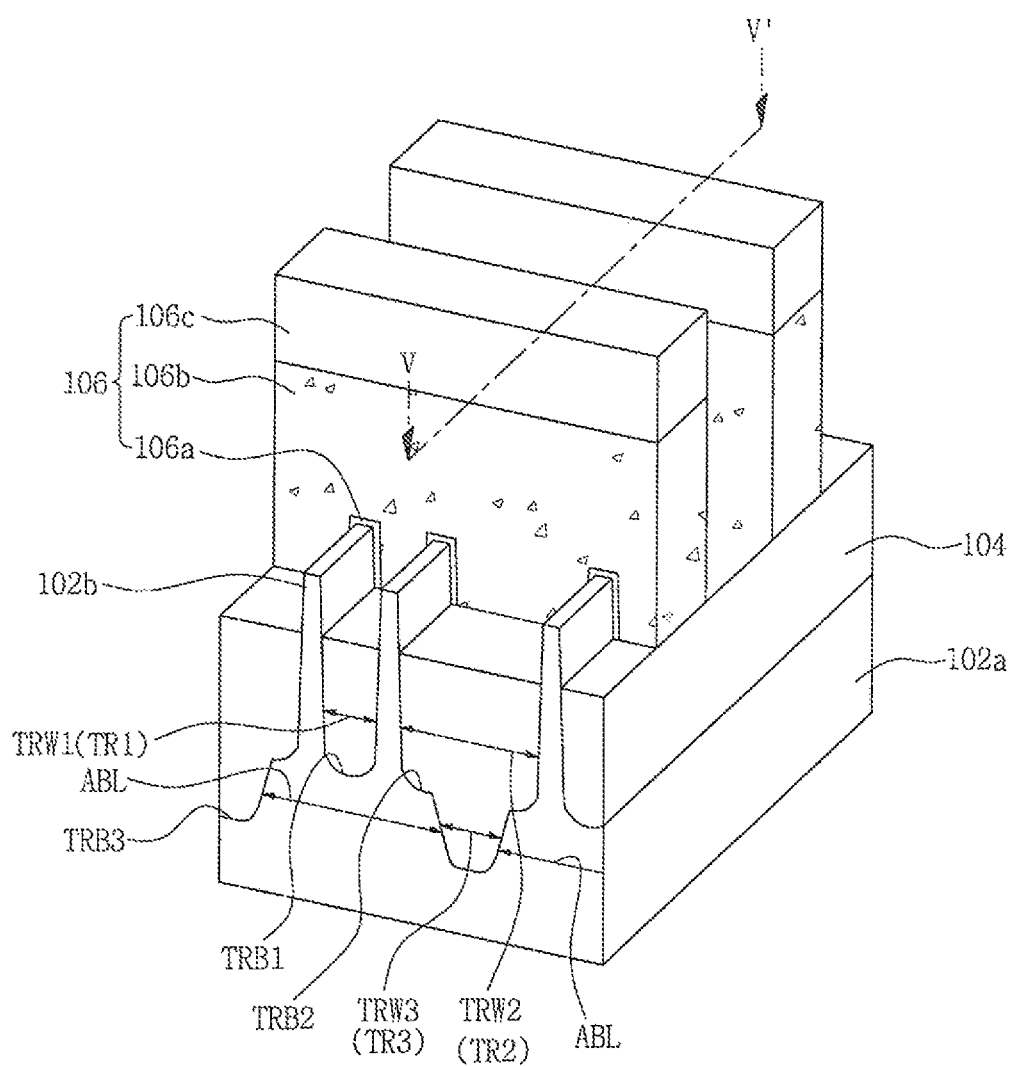
FIGS. 5A, 6A, 7A, 8A, and 9A, 10A, 11A, 12A, and 13A are process perspective views illustrating a method of fabricating a semiconductor device in accordance with an embodiment of the inventive concept according to a process sequence.
Figure 5B:
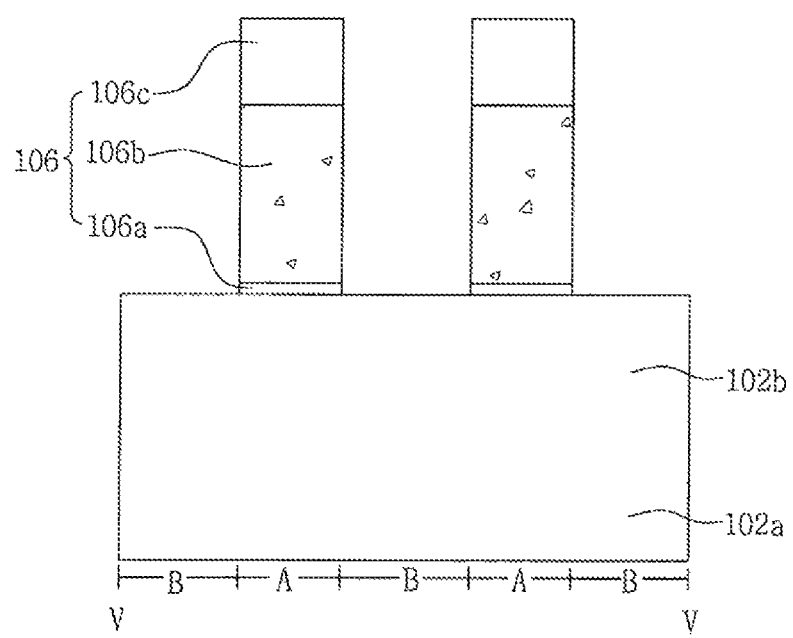
FIGS. 5B, 6B, 7B, 8B, 9B, 10B, 11B, 12B, and 13B are cross-sectional views taken along line V-V' of each perspective view.

Referring to FIGS. 5A and 5B, a method of fabricating a semiconductor device 100a in accordance with an embodiment of the inventive concept may include forming active fins 102b protruding from a single substrate 102a, a device isolation layer 104 covering side surfaces of the active fins 102b, and sacrificial gate stacks 106 crossing the active fins 102b.

The formation of the active fins 102b may include forming first trenches TR1 and second trenches TR2 by recessing the substrate 102a. Bottom surfaces TRB1 of the first trenches TR1 may be disposed at the same level as bottom surfaces TRB2 of the second trenches TR2. Widths TRW1 of the first trenches TR1 and widths TRW2 of the second trenches TR2 may be understood as distances between adjacent active fins 102b. The widths TRW1 of the first trenches TR1 may be smaller than the widths TRW2 of the second trenches TR2. Accordingly, a distance between the active fins 102b sharing the first trenches TR1 may be smaller than a distance between the active fins 102b sharing the second trenches TR2.

The active fins 102b may include first fin areas A and second fin areas B. The first fin areas A may be areas perpendicularly crossed by the sacrificial gate stacks 106, and the second fin areas B may be exposed areas.

The method may further include forming third trenches TR3. The third trenches TR3 may be formed by recessing the bottom surfaces TRB2 of the second trenches TR2. Bottom surfaces TRB3 of the third trenches TR3 may be disposed at a lower level than the bottom surfaces TRB1 of the first trenches TR1 and the bottom surfaces TRB2 of the second trenches TR2.

Active blocks ABL may be separated by the second trenches TR2 and/or third trenches TR3. The active blocks ABL may include the active fins 102b sharing the first trenches TR1. For example, the SRAM may include active blocks ABL having different-type impurities. The third trenches TR3 may electrically insulate the above-described active blocks ABL.

The substrate 102a may be a crystal growth substrate. For example, the substrate 102a may include a Si substrate or a SiGe substrate.

The device isolation layer 104 may fill the first trenches TR1, the second trenches TR2, and the third trenches TR3. Upper surfaces of the device isolation layer 104 may be disposed at a lower level than upper surfaces of the active fins 102b. The upper surfaces of the device isolation layer 104 may be in contact with lower surfaces of the sacrificial gate stacks 106. For example, the device isolation layer 104 may include $SiO_2$.

The sacrificial gate stacks 106 may cross the second fin areas B of the active fins 102b and be spaced apart from each other. The sacrificial gate stacks 106 may include sacrificial dielectric layers 106a, sacrificial gates 106b, and hard masks 106c stacked on upper surfaces of the sacrificial gates 106b. The sacrificial dielectric layers 106a may be formed between the sacrificial gates 106b and the first fin areas A of the active fins 102b. The sacrificial dielectric layers 106a may be silicon oxide layers formed by thermally oxidizing surfaces of the active fins 102b. The sacrificial gates 106b may be in contact with surfaces of the sacrificial dielectric layers 106a and the upper surfaces of the device isolation layer 104. The sacrificial gates 106b may include polysilicon. The hard masks 106c may be used as etch masks for forming the sacrificial gates 106b. The hard masks 106c may include $SiN_x$.

Figure 6A:
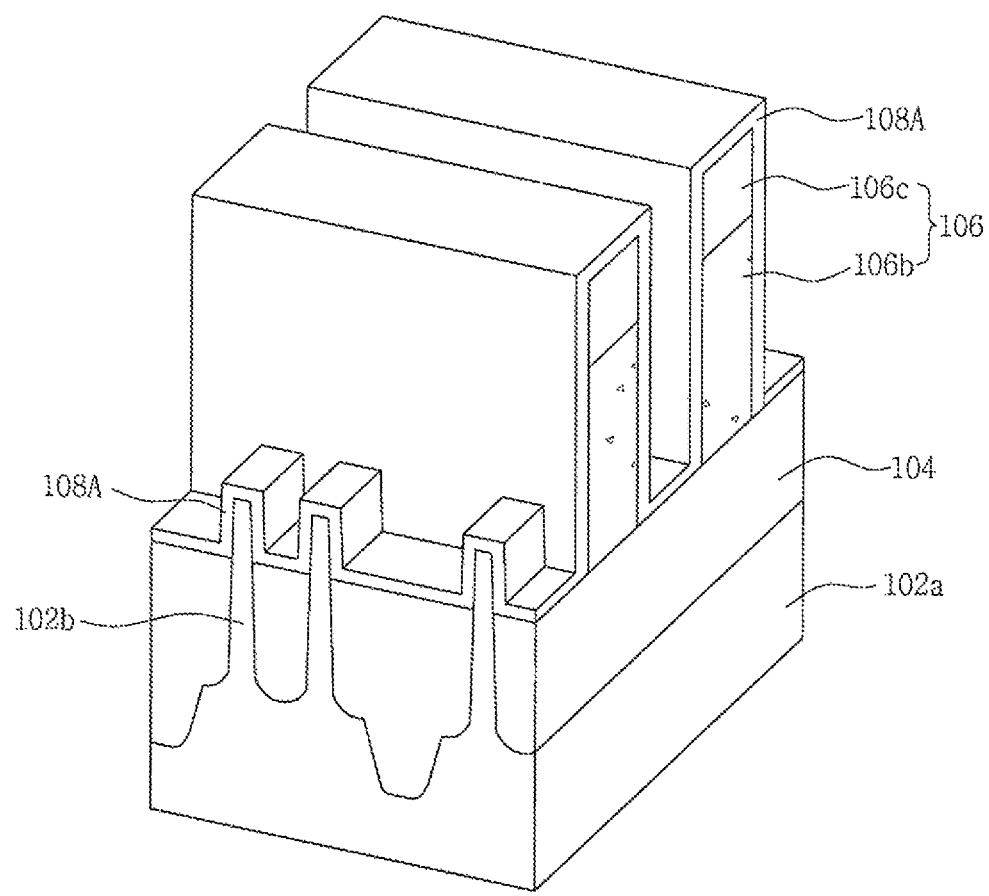
Figure 6B:
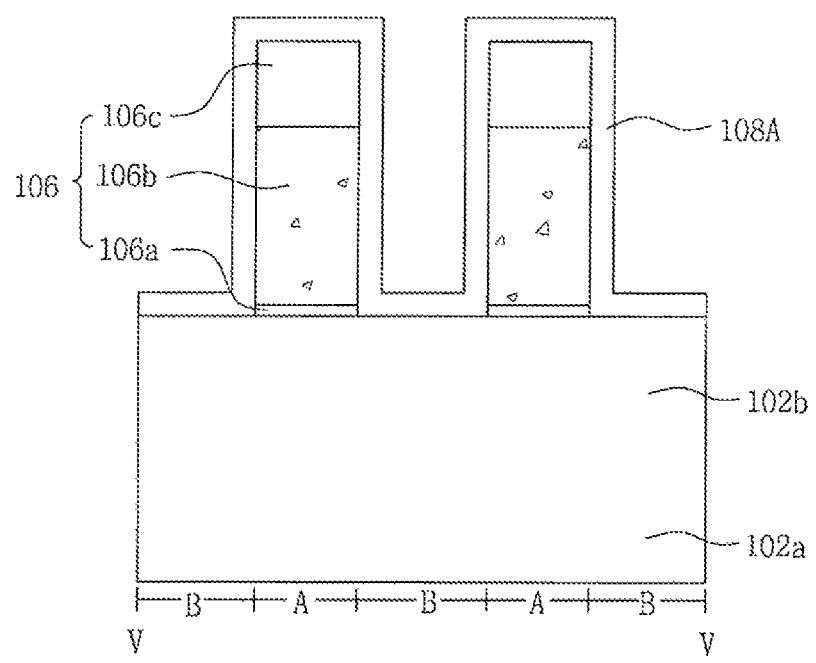

Referring to FIGS. 6A and 6B, the method may include forming a spacer layer 108A.

The spacer layer 108A may conformally cover the sacrificial gate stacks 106, the second fin areas B of the active fins 102b, and the upper surfaces of the device isolation layer 104. The spacer layer 108A may include stacked $SiN_x$ and SiC layers. In some embodiments, the spacer layer 108A may include stacked $SiN_x$ and SiCN layers.

Figure 7A:
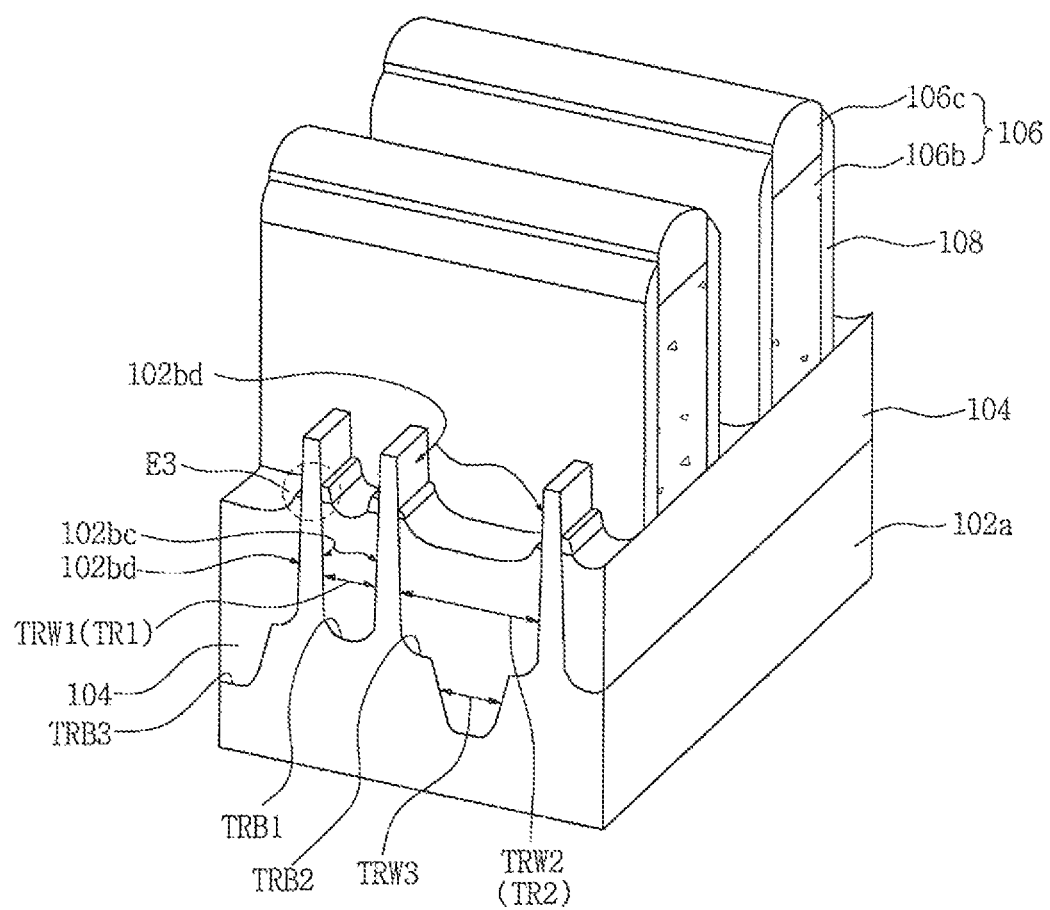
Figure 7A:
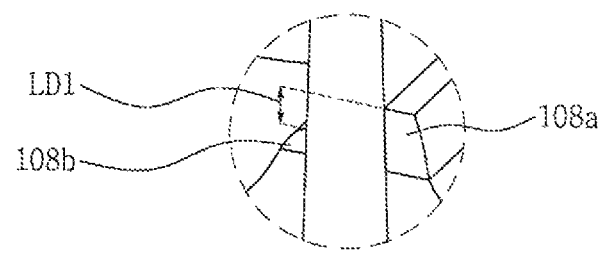

FIG. 7A is a process perspective view, and FIG. 7A is an enlarged view of E3 in FIG. 7A.

Figure 7B:
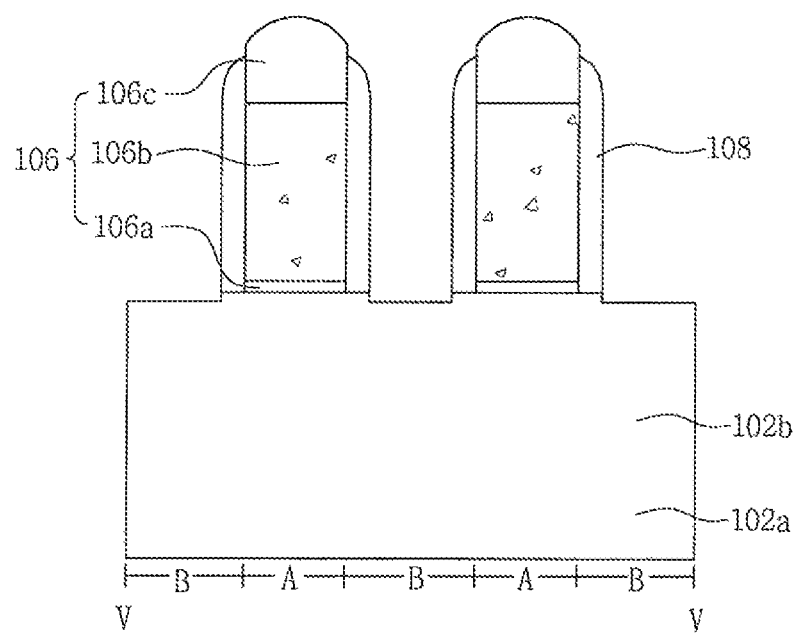

Referring to FIGS. 7A and 7B, the method may include forming spacers 108 on side surfaces of the sacrificial gate stacks 106.

When forming the spacers 108, first residues 108a may remain on first side surfaces 102bc of the active fins 102b sharing the first trenches TR1. Second residues 108b may remain on second side surfaces 102bd sharing the second trenches TR2 and parallel to the first side surfaces 102bc. The second residues 108b may be smaller in volume than the first residues 108a. Upper surfaces of the first residues 108a may be disposed at a higher level than upper surfaces of the second residues 108b. Upper surfaces of the spacers 108 covering side surfaces of the sacrificial gate stacks 106 may be disposed at a lower level than upper surfaces of the hard masks 106c of the sacrificial gate stacks 106.

The second side surfaces 102bd of the active fins 102b may be exposed by level differences LD1 between the upper surfaces of the first residues 108a and the upper surfaces of the second residues 108b.

For example, the spacers 108 may be formed in an etch-back process. The first residues 108a and the second residues 108b may be residues of the spacer layer 108A remaining after the etch-back process is finished. Due to differences between the widths TRW1 of the first trenches TR1 and the widths TRW2 of the second trenches TR2, differences in volume between the first residues 108a and the second residues 108b may be generated. This is because a rate at which the spacer layer 108A formed in the second trenches TR2 having a large width is removed is faster than a rate at which the spacer layer 108A formed in the first trenches TR1 having a small width is removed.

During the etch-back process, the upper surfaces of the device isolation layer 104 may be recessed. The device isolation layer 104 may include upper surfaces covered by the first residues 108a and the second residues 108b, and exposed upper surfaces. Level differences may exist between the upper surfaces of the device isolation layer 104. For example, in the device isolation layer 104, the upper surfaces covered by the first residues 108a and the second residues 108b may be disposed at a higher level than the exposed upper surfaces.

Figure 8A:
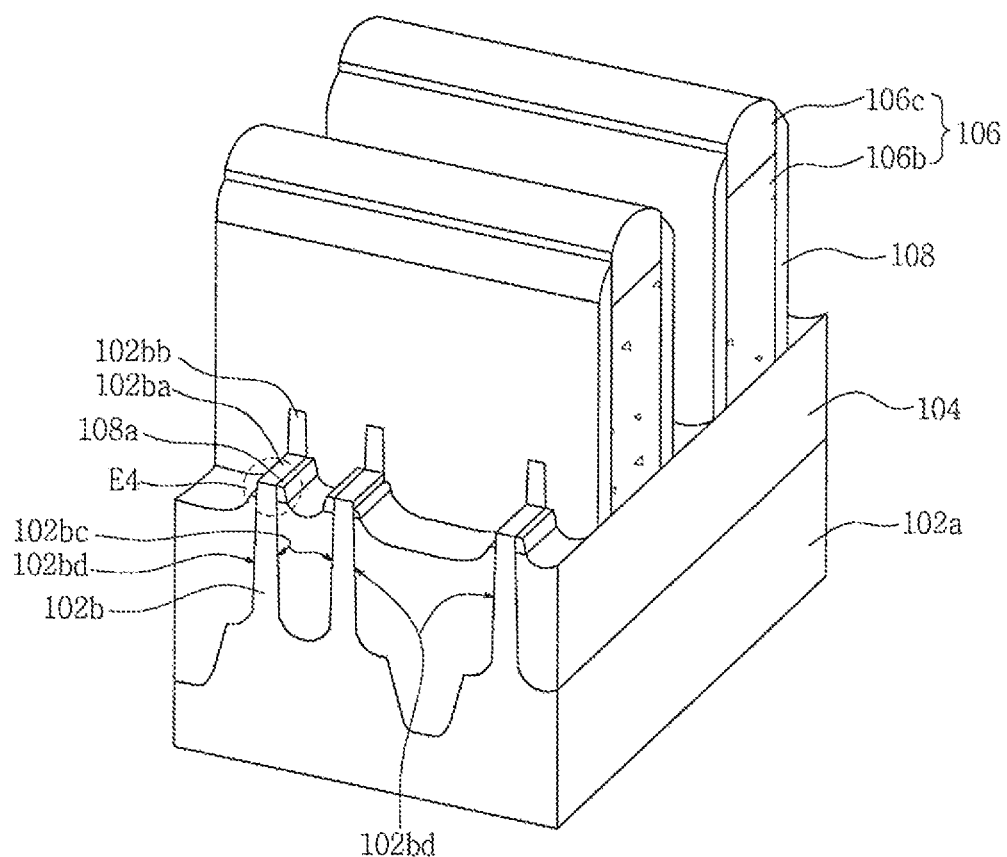
Figure 8A:
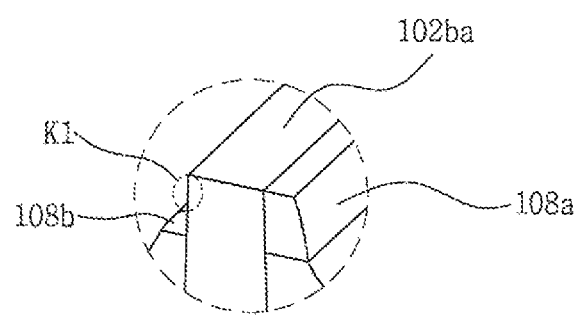

FIG. 8A is a process perspective view, and FIG. 8A is an enlarged view of E4 in FIG. 8A.

Figure 8B:
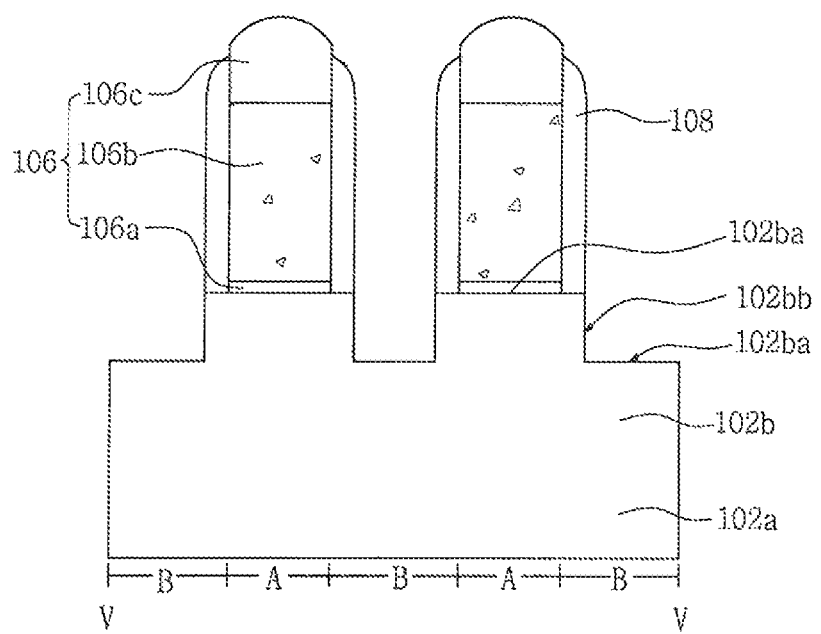

Referring to FIGS. 8A and 8B, the method may include recessing the second fin areas B of the active fins 102b.

The recessing process of the second fin areas B may include removing portions of the active fins 102b which are not covered by the device isolation layer 104. The recessed second fin areas B may include recessed upper surfaces 102ba and recessed side surfaces 102bb. The recessed upper surfaces 102ba of the second fin areas B may be disposed at a lower level than upper surfaces 102ba' of the first fin areas A. For example, the active fins 102b may have a concave-convex shape including concave portions and convex portions.

The recessed upper surfaces 102ba of the second fin areas B may be disposed at the same level as or a lower level than the upper surfaces of the first residues 108a, and disposed at a higher level than the upper surfaces of the second residues 108b. The second side surfaces 102bd of the second fin areas B may include exposed portions K1. The exposed portions K1 may be portions exposed by level differences between the upper surfaces of the second residues 108b and the recessed upper surfaces 102ba of the second fin areas B.

Hereinafter, since E1 of FIG. 9A has the same configuration as that of FIG. 1A, this figure may be referred to.

Figure 9A:
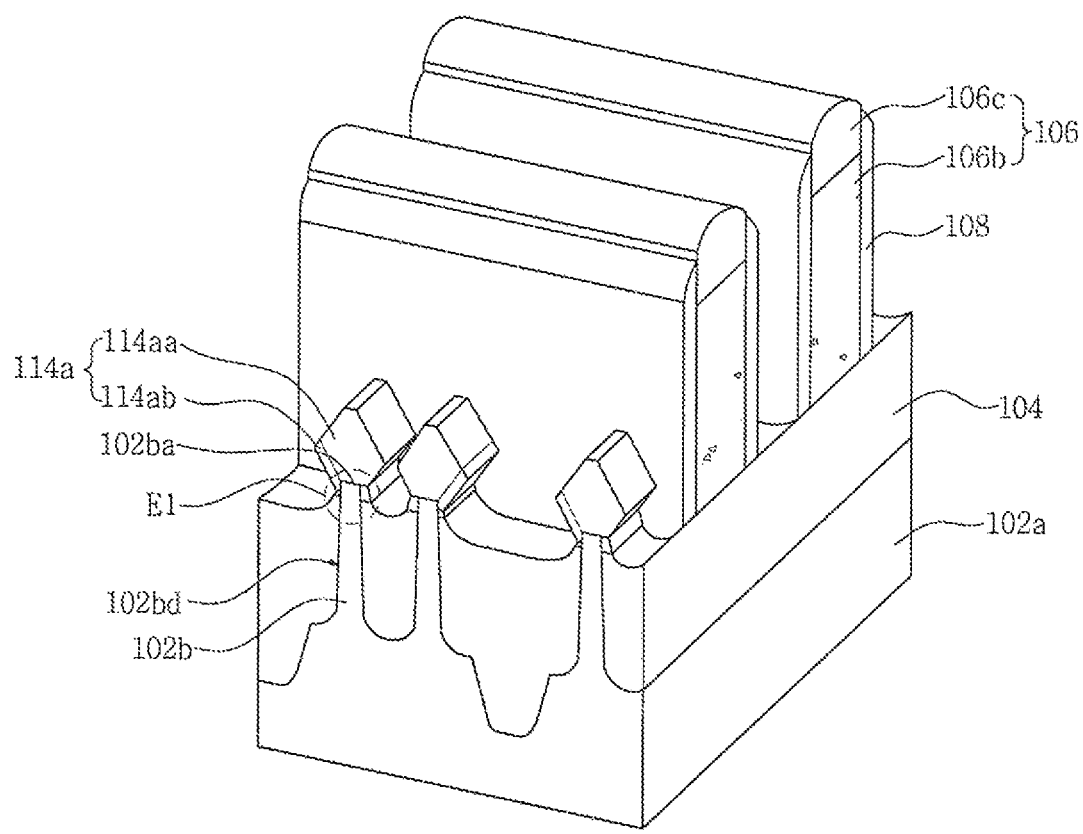
Figure 9B:
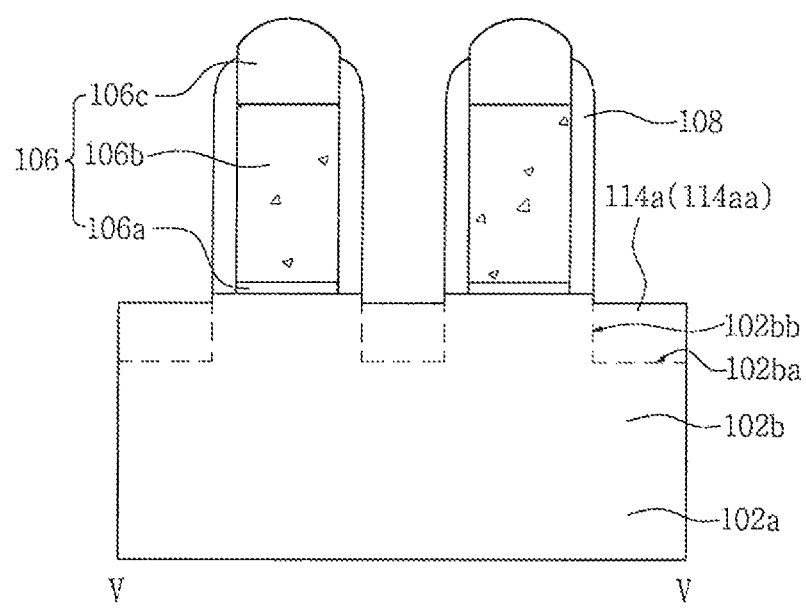

Referring to FIGS. 9A and 9B together with FIG. 1A, the method may include performing a crystal growth process to grow source/drains 114a from the recessed upper surfaces 102ba and recessed side surfaces 102bb of the active fins 102b.

The source/drains 114a may be grown to have a left-right asymmetric diamond shape. The source/drains 114a having the left-right asymmetric diamond shape may include main growth portions 114aa and additional growth portions 114ab.

The main growth portions 114aa may be portions grown from the recessed upper surfaces 102ba and recessed side surfaces 102bb of the active fins 102b, and the additional growth portions 114ab may be portions grown from the exposed portions K1 of the second side surfaces 102bd of the active fins 102b. The main growth portions 114aa may have a diamond shape, and the additional growth portions 114ab may have a rectangular shape. The main growth portions 114aa and the additional growth portions 114ab may share a plane.

Lower surfaces of the main growth portions 114aa may be in contact with the upper surfaces of the active fins 102b and the upper surfaces of the first residues 108a. Lower surfaces of the additional growth portions 114ab may be in contact with the exposed portions K1 of the second side surfaces 102bd of the active fins 102b, and the upper surfaces of the second residues 108b. The lower surfaces of the additional growth portions 114ab may be disposed at a lower level than the lower surfaces of the main growth portions 114aa.

For example, the source/drains 114a may be formed in an epitaxial growth process. The source/drains 114a may include Si, SiGe, or SiC. The source/drains 114a may include impurities. The source/drains 114a may include N-type impurities or P-type impurities. The impurities may be distributed differently in the source/drains 114a. For example, while the crystal growth process is performed, the dopant concentration may be increased based on the active fins 102b.

Figure 10A:
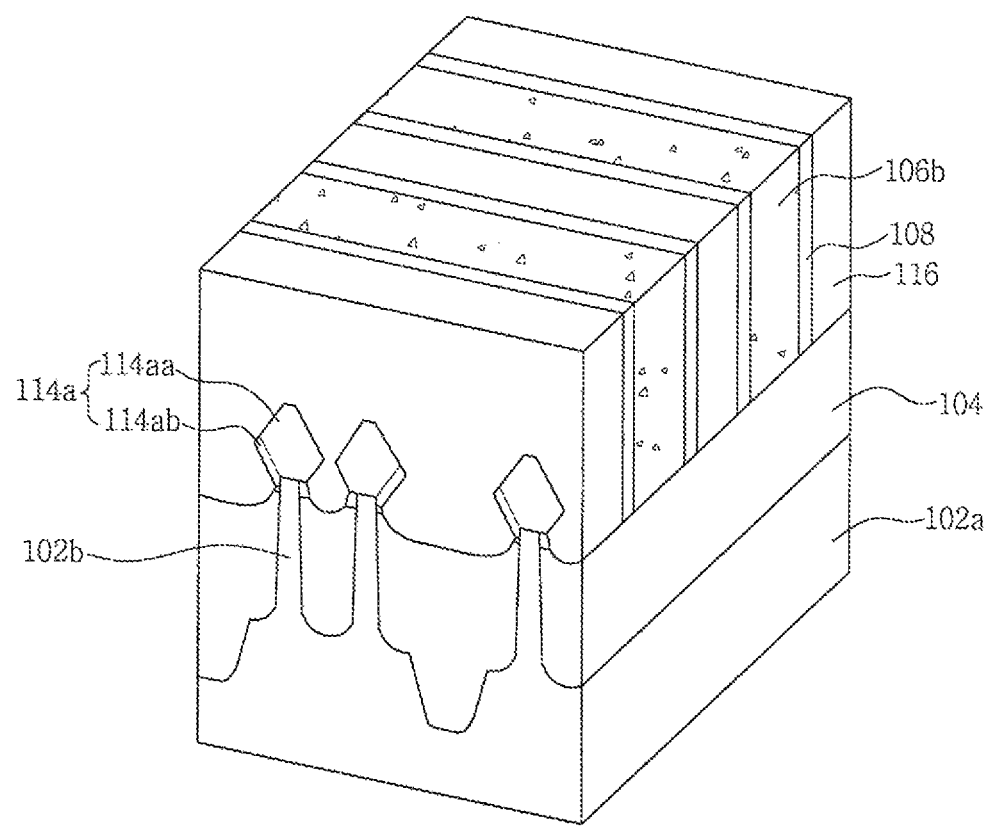
Figure 10B:
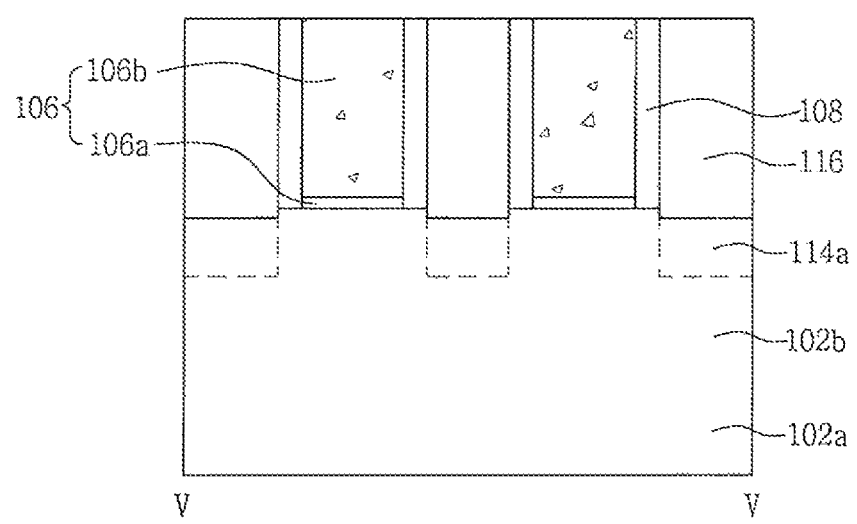

Referring to FIGS. 10A and 10B, the method may include forming an interlayer insulating layer 116 covering the source/drains 114a, and removing the hard masks 106c.

Upper surfaces of the interlayer insulating layer 116, the spacers 108, and the sacrificial gate 106b may be disposed at the same level. The interlayer insulating layer 116 may include $SiO_2$.

Figure 11A:
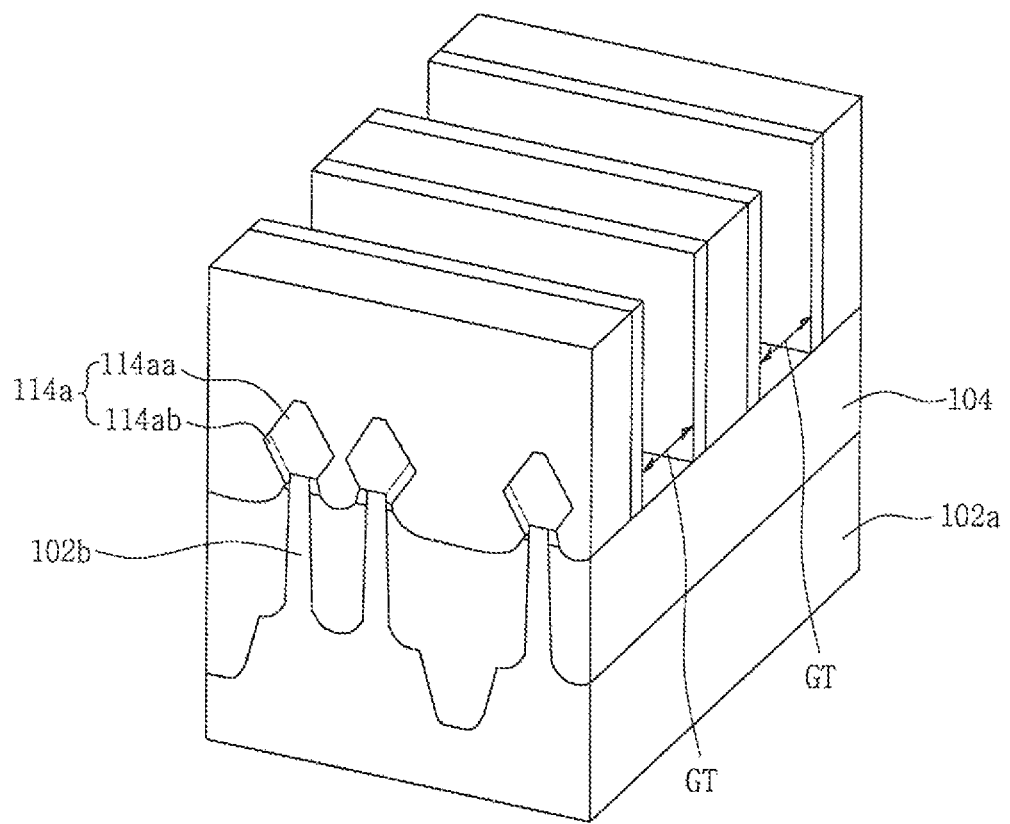
Figure 11B:
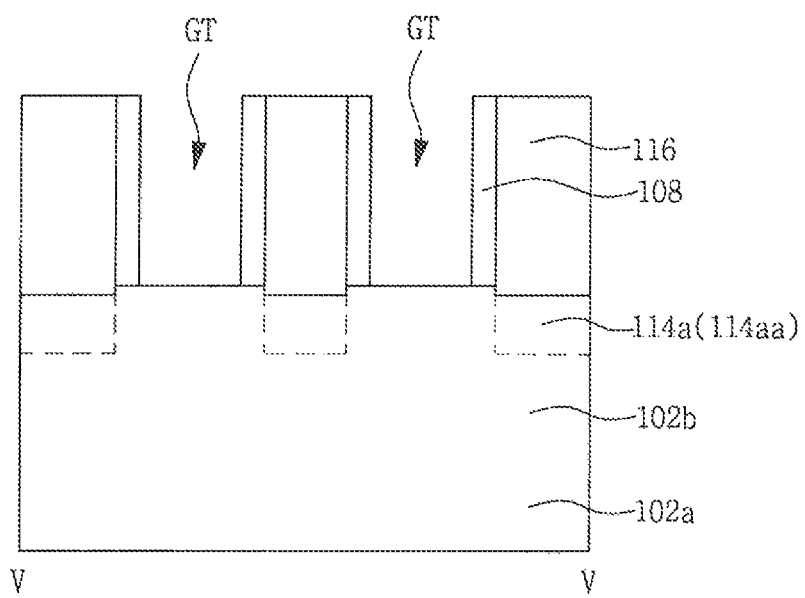

Referring to FIGS. 11A and 11B, the method may include forming gate trenches GT.

The formation of the gate trenches GT may include removing the sacrificial gates 106b. Here, the sacrificial dielectric layers 106a may serve to prevent the active fins 102b from being damaged while the sacrificial gates 106b are removed. The sacrificial dielectric layer 106a may be removed together with the sacrificial gates 106b or may remain.

Side surfaces the gate trenches GT may be side surfaces of the spacers 108. Lower surfaces of the gate trenches GT may be the surfaces of the device isolation layer 104 and the surfaces of the active fins 102b exposed by the gate trenches GT. When the sacrificial dielectric layers 106a remain, the bottom surfaces of the gate trenches GT may be the surfaces of the device isolation layer 104 and surfaces of the sacrificial dielectric layers 106a surrounding the active fins 102b.

Figure 12A:
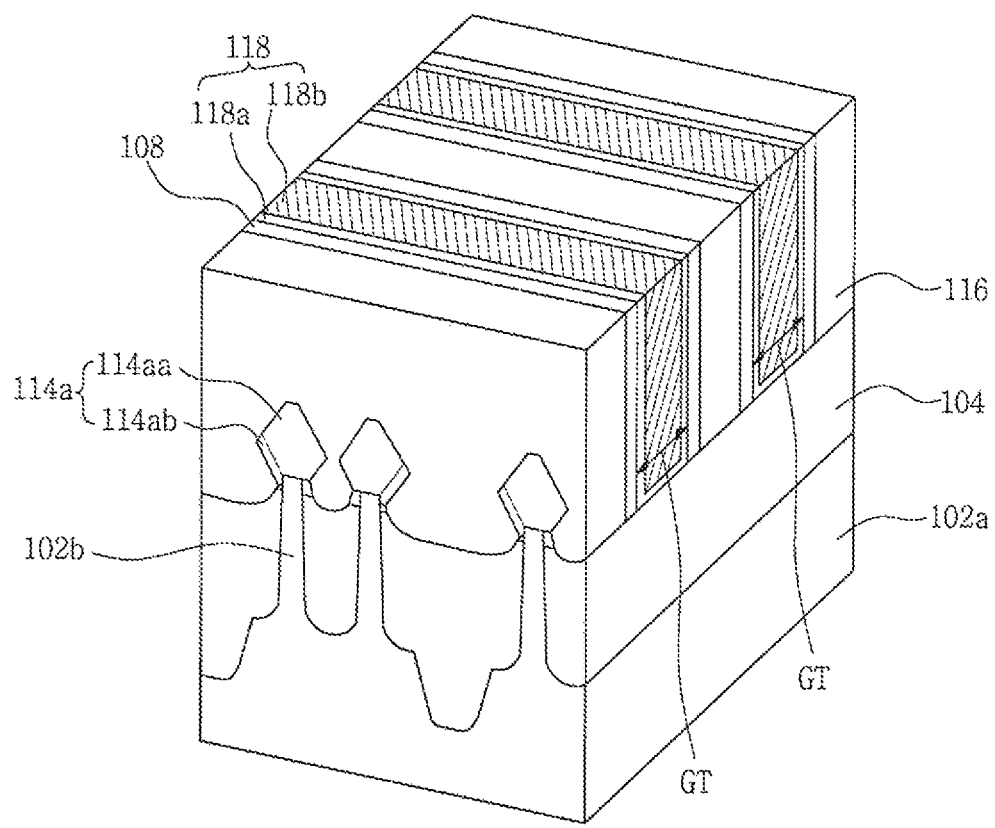
Figure 12B:
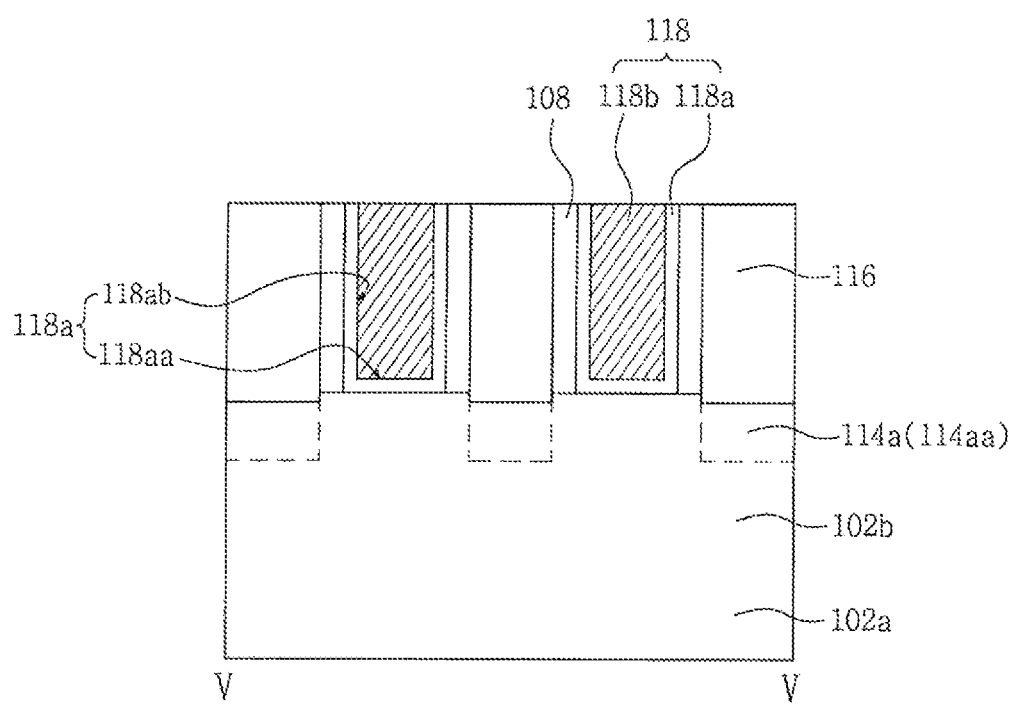

Referring to FIGS. 12A and 12B, the method may include forming gate stacks 118 in the gate trenches GT.

The gate stacks 118 may include gate dielectric layers 118a and gate electrodes 118b. The gate dielectric layers 118a may include lower surfaces 118aa and side surfaces 118ab perpendicular to the lower surfaces 118aa. The lower surfaces 118aa of the gate dielectric layers 118a may be conformally formed on the surfaces of the device isolation layer 104, and the side and upper surfaces of the active fins 102b exposed in the gate trenches GT. The side surfaces 118ab of the gate dielectric layers 118a may be in contact with the side surfaces of the gate trenches GT. The gate electrodes 118b may be in contact with the lower surfaces 118aa and the side surfaces 118ab of the gate dielectric layers 118a and may fill the gate trenches GT. Upper surfaces of the gate dielectric layers 118a, gate electrodes 118b, and interlayer insulating layer 116 may be disposed at the same level.

The gate dielectric layers 118a may include a high-k material. When the gate dielectric layers 118a are formed of the high-k material, it is advantageous for reducing leakage current even when the gate dielectric layers 118a are thin. The high-k material may include $HfO_2$, $Al_2O_3$, $ZrO_2$, or $Ta_2O_5$. The gate electrodes 118b may include W or Al. In some embodiments, the gate electrodes 118b may have a stacked structure including buffer layers. The buffer layers may include titanium nitride (TiN) or tantalum nitride (TaN).

Figure 13A:
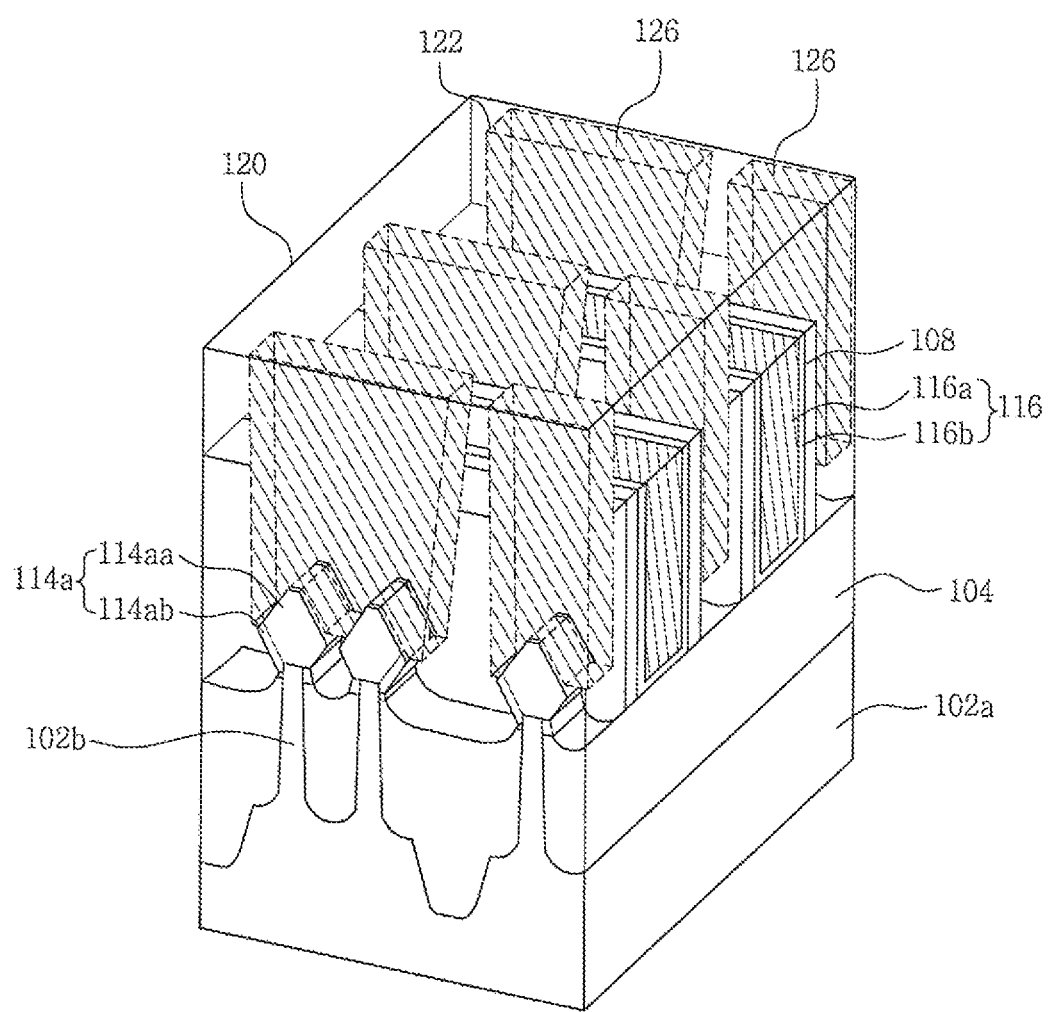
Figure 13B:
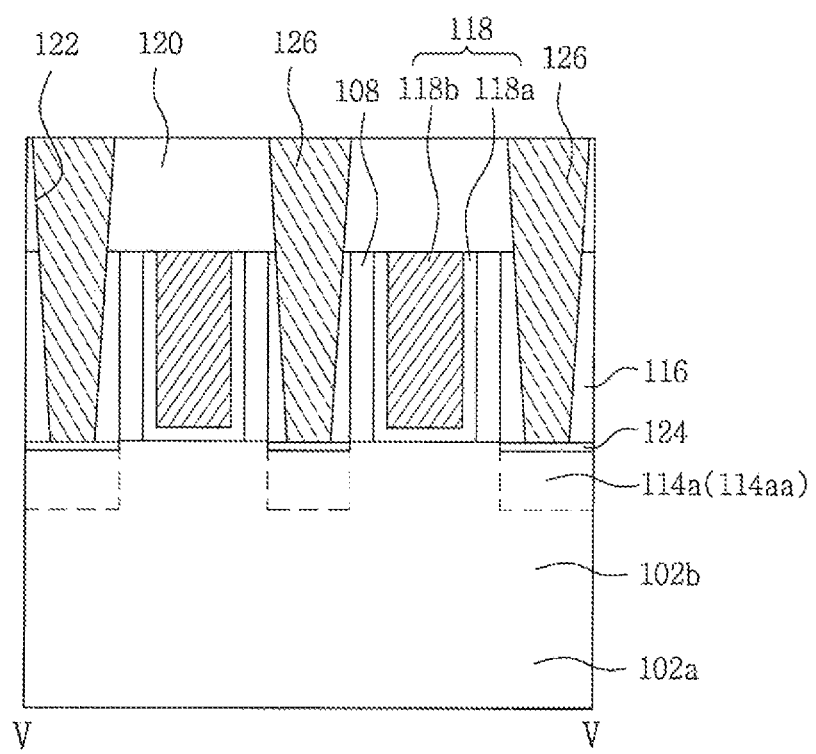

Referring to FIGS. 13A and 13B, the method may include forming a protection layer 120, via holes 122, and contact electrodes 126.

The protection layer 120 may cover the upper surfaces of the gate electrodes 118b and the upper surface of the interlayer insulating layer 116. The protection layer 120 may include $SiO_x$.

The via holes 122 may pass through the interlayer insulating layer 116 and the protection layer 120. Upper surfaces of the via holes 122 may have a bar shape extending in a direction. Due to the via holes 122, surfaces of the main growth portions 114aa of the source/drains 114a and surfaces of the additional growth portions 114ab may be exposed.

The contact electrodes 126 may fill the via holes 122 and contact the source/drains 114aa. The contact electrodes 126 may be referred to as plugs. The contact electrodes 126 may include W.

Figure 17:
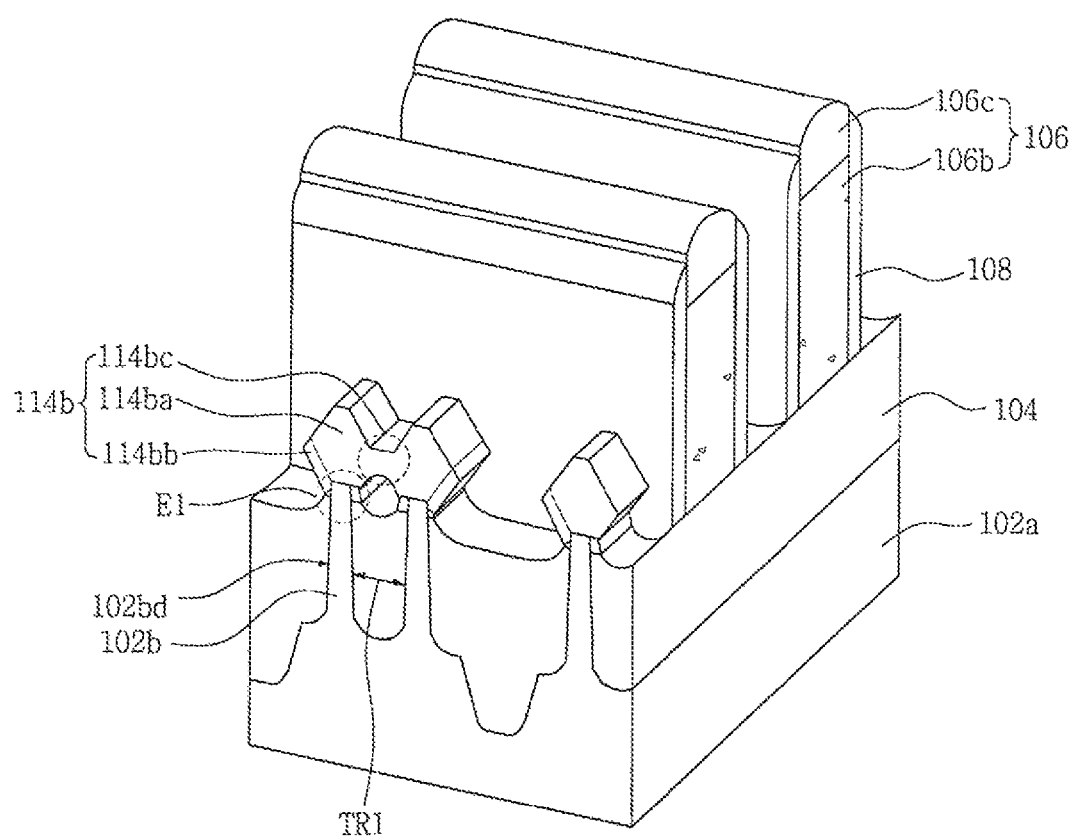
FIG. 17 is a process perspective view illustrating a method of fabricating a semiconductor device in accordance with embodiments of the inventive concept.

In some embodiments, the contact electrodes 126 may be used in conjunction with the device of FIG. 17 including a merging crystal growth between adjacent source/drains. The contact electrodes 126 may be in direct contact with the first diamond-shaped source/drain, the second diamond-shaped source/drain, and the merging crystal growth.

The method may further include forming silicide layers 124 on the surfaces of the source/drains 114a exposed through the via holes 122. The formation of the silicide layers 124 may include injecting a conductive metal on the exposed source/drains 114a in the via holes 122, and performing a thermal treatment process. The silicide layers 124 may be formed between the source/drains 114a and the contact electrodes 126.

Through the above-described processes, a semiconductor device in accordance with the embodiment of the inventive concept may be fabricated.

Figure 14:
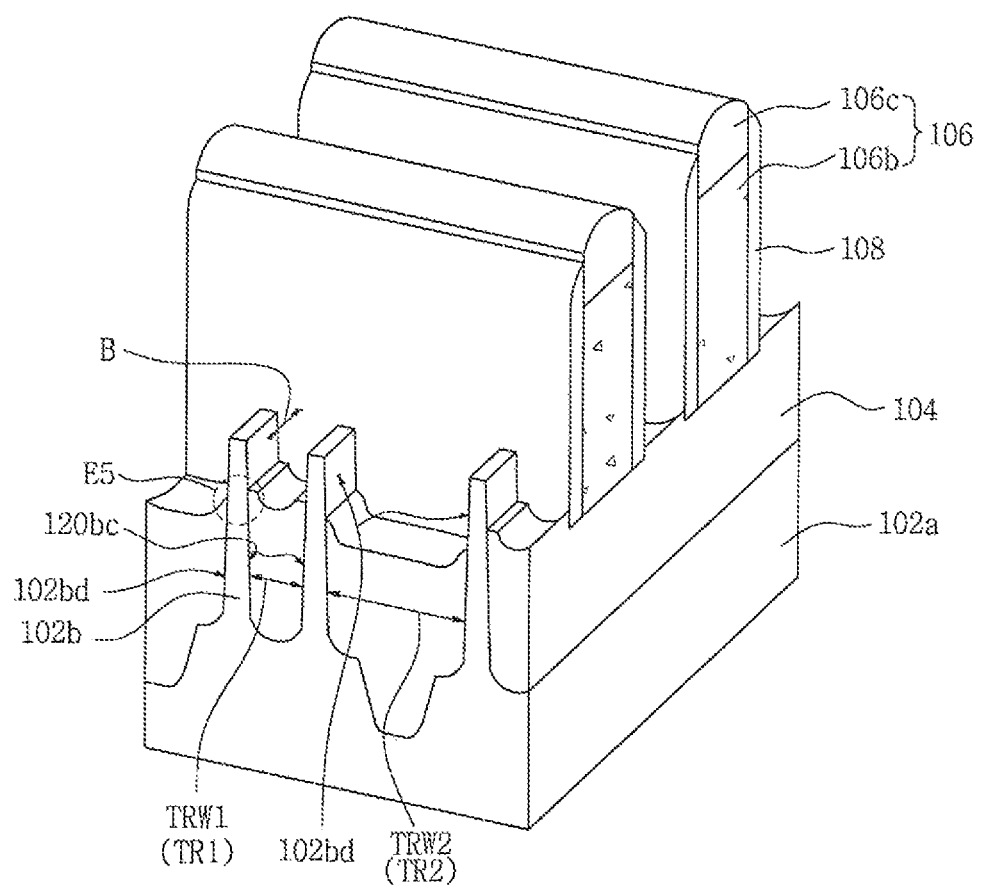
FIGS. 14, 15, and 16 are process perspective views illustrating a method of fabricating a semiconductor device in accordance with embodiments of the inventive concept.
Figure 14:
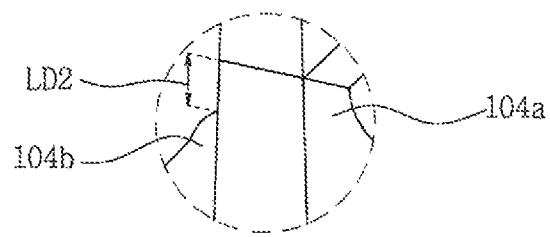
Figure 15:
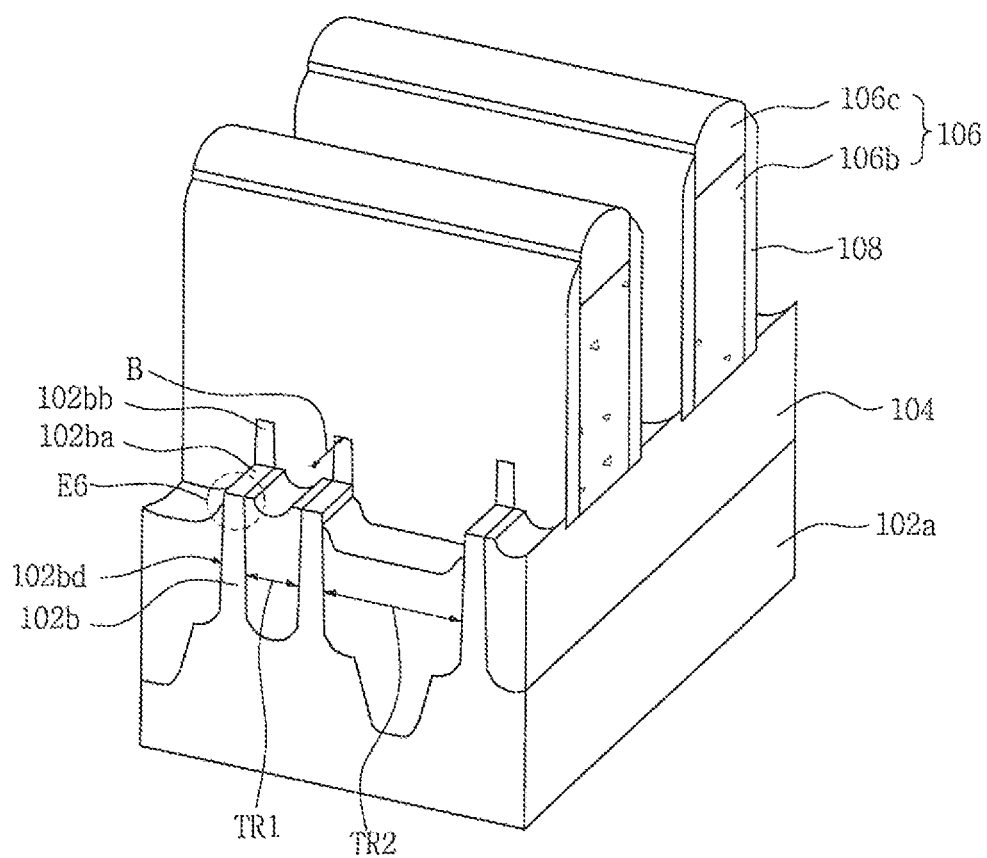
Figure 15:
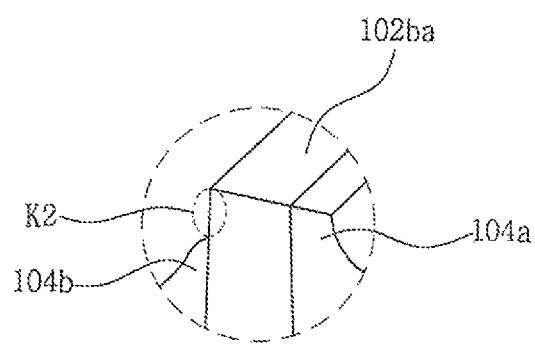
Figure 16:
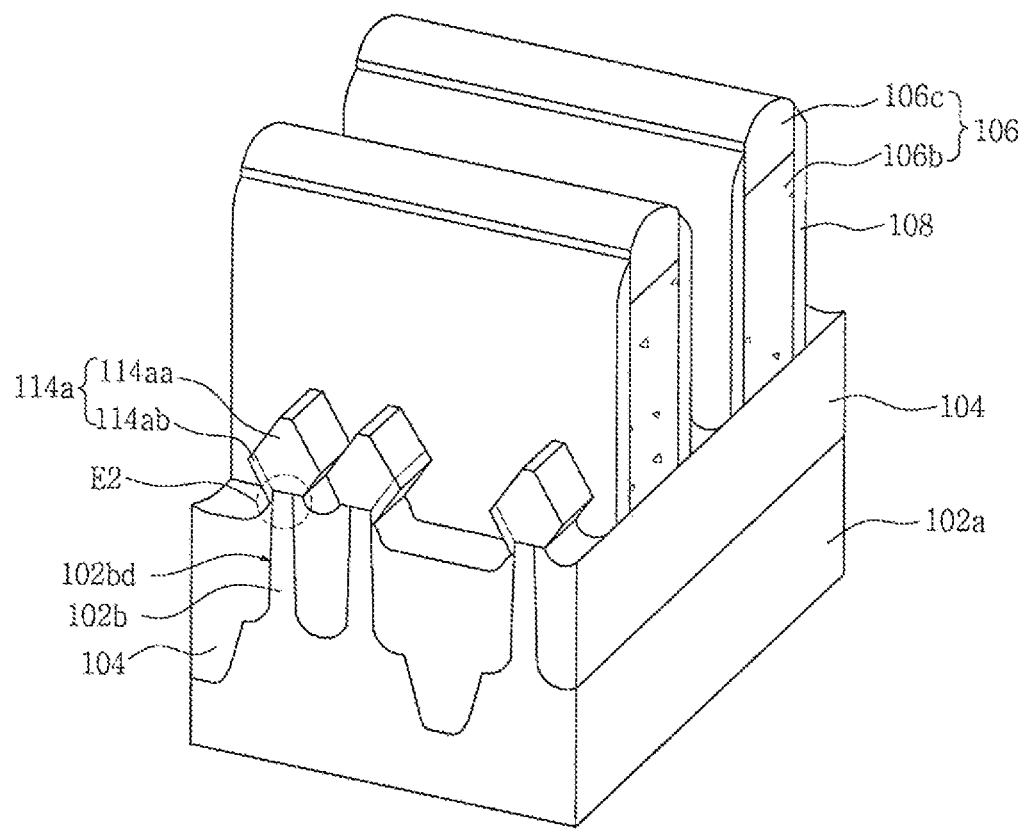
Figure 16:
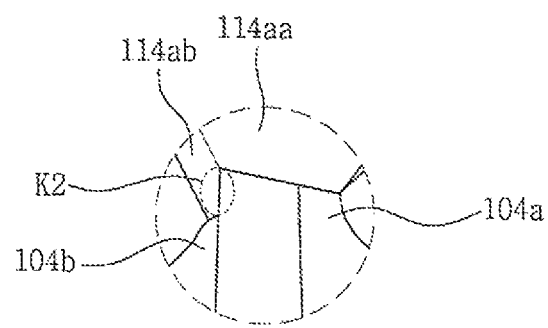

FIGS. 14 to 16 are process perspective views illustrating a method of fabricating a semiconductor device in accordance with embodiments of the inventive concept. FIG. 14 may be understood as illustrating a process to be performed after the process described with reference to FIGS. 5A and 5B among the above-described processes.

FIG. 14 is a process perspective view, and FIG. 14 is an enlarged view of E5 in FIG. 14.

Referring to FIGS. 14, 6A, and 6B, the method of fabricating the semiconductor device 100c in accordance with the other embodiment of the inventive concept may include forming spacers 108 on side surfaces of the sacrificial gate stacks 106.

The formation of the spacers 108 may include partially removing the spacer layer 108A through an etching process. During the etching process, in the spacer layer 108A, portions covering the second fin areas B of the active fins 102b and portions covering the hard masks 116c may be removed. Subsequently, the upper surface of the device isolation layer 104 may be over-etched.

The upper surface of the device isolation layer 104 filling the first trenches TR1 and the second trenches TR2 may be disposed at a high level and a low level. The high level may be understood as the highest level of the upper surface of the device isolation layer 104, and the low level may be understood as the lowest level of the upper surface of the device isolation layer 104. Since the portion disposed at the high level protrudes relative to the portion disposed at the low level, it is referred to as a "protrusion" hereinafter.

Accordingly, the device isolation layer 104 filling the first trenches TR1 may include first protrusions 104a protruding from side surfaces of the first trenches TR1. The device isolation layer 104 filling the second trenches TR2 may include second protrusions 104b protruding from side surfaces of the second trenches TR2. Upper surfaces of the first protrusions 104a may be disposed at a higher level than upper surfaces of the second protrusions 104b. Accordingly, first side surfaces 102bc of the active fins 102b, that is, side surfaces of the first trenches TR1 may include the first protrusions 104a, and second side surfaces 102bd parallel to the first side surfaces 102bc of the active fins 102b, that is, side surfaces of the second trenches TR2 may include the second protrusions 104b. Accordingly, the second side surfaces 102bd of the active fins 102b may be more exposed by level differences LD2 between the upper surfaces of the first protrusions 104a and the upper surface of the second protrusions 104b.

More specifically, the first protrusions 104a and the second protrusions 104b may be formed since upper surfaces of the device isolation layer 104 corresponding to center portions of trenches TR1 and TR2 are recessed at a faster rate than upper surfaces of the device isolation layer 104 adjacent to the side surfaces of the first trenches TR1 and second trenches TR2. In addition, the first protrusions 104a and the second protrusions 104b may have a level difference since the device isolation layer 104 formed in the second trenches TR2 having a large widths is removed faster than the device isolation layer 104 formed in the first trenches TR1 having a small widths.

Hereafter, FIG. 15 is a process perspective view, and FIG. 15 is an enlarged view of E6 in FIG. 15.

Referring to FIGS. 15 and 8B, the method may include recessing the second fin areas B of the active fins 102b.

The recess of the second fin areas B may include removing portions of the active fins 102b which are exposed without being covered by the device isolation layer 104. The recessed second fin areas B may include recessed upper surfaces 102ba and recessed side surfaces 102bb. The recessed upper surfaces 102ba of the second fin areas B may be disposed at a lower level than upper surfaces 102ba' of the first fin areas A. For example, the active fins 102b may have a concave-convex shape including concave portions and convex portions.

The recessed upper surfaces 102ba of the second fin areas B may be disposed at the same level as or a lower level than the upper surfaces of the first protrusions 104a, and at a lower level than the upper surfaces of the second protrusions 104b. The second side surfaces 102bd of the second fin areas B may include exposed portions K2. The exposed portions K2 may be portions exposed as by level differences between the recessed upper surfaces 102ba of the second fin areas B and the upper surfaces of the second protrusions 104b.

Hereinafter, FIG. 16 is a process perspective view, and FIG. 16 is an enlarged view of E2 in FIG. 16. Referring to FIG. 16, the method may include performing a crystal growth process to grow source/drains 114a in the recessed second fin areas B.

The source/drains 114a may have an asymmetric diamond shape. The source/drains 114a may include main growth portions 114aa and additional growth portions 114ab. The main growth portions 114aa may be portions grown in a diamond shape from the recessed upper surfaces 102ba and the recessed side surfaces 102bb of the active fins 102b. The additional growth portions 114ab may be portions grown from the exposed portions K2 of the second side surfaces 102bd of the active fins 102b. The additional growth portions 114ab may have a rectangular shape. The main growth portions 114aa and the additional growth portions 114ab may share a plane.

Lower surfaces of the main growth portions 114aa may be in contact with the upper surfaces of the active fins 102b and the upper surfaces of the first protrusions 104a. Lower surfaces of the additional growth portions 114ab may be in contact with the exposed portions K2 of the second side surfaces 102bd of the active fins 102b, and the upper surfaces of the second protrusions 104b. The lower surfaces of the additional growth portions 114ab may be disposed at a lower level than the lower surfaces of the main growth portions 114aa.

For example, the source/drains 114a may be crystallized through an epitaxial process.

Subsequent processes may be the same as the processes described above with reference to FIGS. 10A, 11A, 12, and 13A.

FIG. 17 is a process perspective view illustrating a method of fabricating a semiconductor device in accordance with embodiments of the inventive concept.

Processes performed before a process to be described with reference to FIG. 17 may be the same as the processes described with reference to FIGS. 5A to 8A in the above-described embodiment. Since E1 of FIG. 17 has the same configuration as those of FIG. 1A, this figure may be referred to.

Referring to FIGS. 15, 17, and 1A, the method of fabricating a semiconductor device in accordance with the other embodiment of the inventive concept may include forming merged source/drains 114b.

The merged source/drains 114b may be in contact with a plurality of active fins 102b, and may include main growth portions 114ba, additional growth portions 114bb, and merged growth portions 114bc. The main growth portions 114ba may be portions grown from recessed upper surfaces 102ba and recessed side surfaces 102bb of the active fins 102b. The additional growth portions 114bb may be portions grown from exposed portions K1 of second side surfaces 102bd of the active fins 102b. The additional growth portions 114bb may be disposed at one side and the other side of the merged source/drains 114b. The main growth portions 114ba may share a plane with the additional growth portions 114bb. The main growth portions 114ba may have a diamond shape, the additional growth portions 114bb may have a rectangular shape, and the merged growth portions 114bc may be understood as a shape in which edges of the main growth portions 114ba are merged. More specifically, the merged growth portions 114bc may be portions in which adjacent edges of the main growth portions 114ba are merged and the merged portions are extended upwardly and downwardly during a crystal growth process.

In the above-described configuration, first residues 108a may remain on first side surfaces 102bc of the active fins 102b, that is, side surfaces of first trenches TR1, and upper surfaces of a device isolation layer 104. Second residues 108b may remain on the second side surfaces 102bd parallel to the first side surfaces 102bc, and lower surfaces of the additional growth portions 114bb. Lower surfaces of the main growth portions 114ba may be in contact with upper surfaces of the active fins 102b and upper surfaces of the first residues 108a, and the lower surfaces of the additional growth portions 114bb may be in contact with the side surfaces of the active fins 102b and upper surfaces of the second residues 108b. The lower surfaces of the additional growth portions 114bb may be disposed at a lower level than the lower surfaces of the main growth portions 114ba. Lower surfaces of the merged growth portions 114bc may be disposed at a higher level than the lower surfaces of the main growth portions 114ba.

In some embodiments, referring to FIG. 4, the first and second residues 108a and 108b may be fully removed, first protrusions 104a extending from the device isolation layer 104 may exist on the first side surfaces 102bc of the active fins 102b, and second protrusions 104b extending from the device isolation layer 104 may exist on the second side surfaces 102bd parallel to the first side surfaces 102bc.

Subsequent processes may be the same as the processes described above with reference to FIGS. 13A and 13B and FIGS. 14A and 14B.

Figure 18:
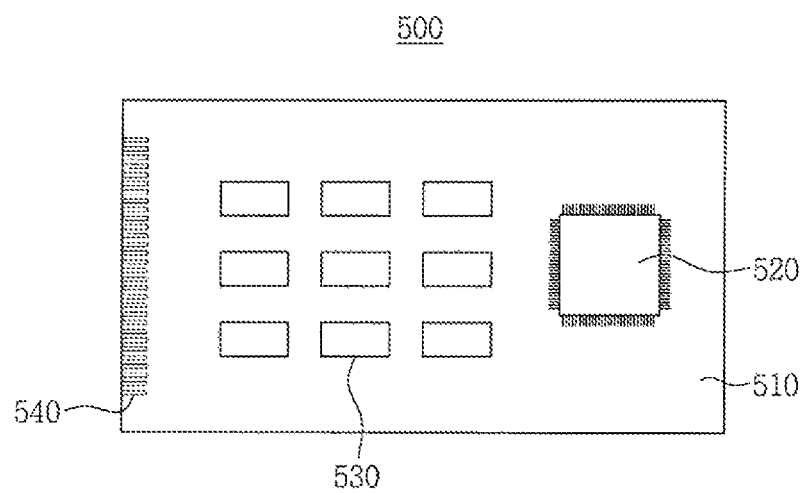
FIG. 18 is a view conceptually illustrating a semiconductor module including at least one of semiconductor devices in accordance with embodiments of the inventive concept.

FIG. 18 is a view conceptually illustrating a semiconductor module including a semiconductor device 100a, 100b, 100c, or 100d fabricated in accordance with various embodiments of the inventive concept.

Referring to FIG. 18, a semiconductor module 500 in accordance with an embodiment of the inventive concept may include a semiconductor device 100a, 100b, 100c, or 100d fabricated in accordance with various embodiments of the inventive concept. The semiconductor module 500 may further include a microprocessor 520 mounted on a module substrate 510. Input/output terminals 540 may be disposed on at least one side of the module substrate. The semiconductor module 500 may include a memory card or a solid state drive (SSD).

Figure 19:
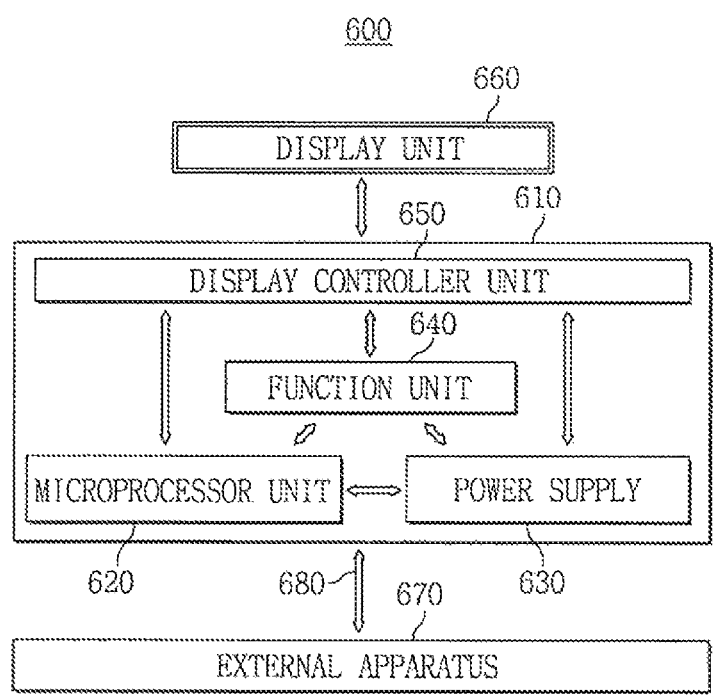
FIGS. 19 and 20 are block diagrams conceptually illustrating electronic systems including at least one of semiconductor devices in accordance with embodiments of the inventive concept.

FIG. 19 is a block diagram conceptually illustrating an electronic system including the semiconductor device 100a, 100b, 100c, or 100d fabricated in accordance with various embodiments of the inventive concept.

Referring to FIG. 19, the semiconductor device 100a, 100b, 100c, or 100d may be applied to an electronic system 600. The electronic system 600 may include a body 610, a microprocessor unit 620, a power supply 630, a function unit 640, and/or a display controller unit 650. The body 610 may be a system board or motherboard including a printed circuit board (PCB). The microprocessor unit 620, the power supply 630, the function unit 640, and the display controller unit 650 may be installed or mounted on the body 610. A display unit 660 may be disposed on a surface of the body 610 or outside of the body 610. For example, the display unit 660 may be disposed on the surface of the body 610 and display an image processed by the display controller unit 650. The power supply 630 may receive a constant voltage from an external power source, etc., divide the voltage into various levels of required voltages, and supply those voltages to the microprocessor unit 620, the function unit 640, and the display controller unit 650, etc. The microprocessor unit 620 may receive a voltage from the power supply 630 to control the function unit 640 and the display unit 660. The function unit 640 may perform various functions of the electronic system 600. For example, when the electronic system 600 is a mobile electronic apparatus, such as a mobile phone, the function unit 640 may have several components which perform wireless communication functions, such as output of an image to the display unit 660 or output of a voice to a speaker, by dialing or communication with an external apparatus 670. When a camera is installed, the function unit 640 may function as an image processor. In the embodiment to which the inventive concept is applied, when the electronic system 600 is connected to a memory card, etc. in order to expand a capacity thereof, the function unit 640 may be a memory card controller. The function unit 640 may exchange signals with the external apparatus 670 through a wired or wireless communication unit 680. Further, when the electronic system 600 needs a Universal Serial Bus (USB), etc. in order to expand functionality, the function unit 640 may function as an interface controller. The semiconductor device 100a, 100b, 100c, or 100d fabricated in accordance with the embodiments of the inventive concept may be included in the function unit 640.

Figure 20:
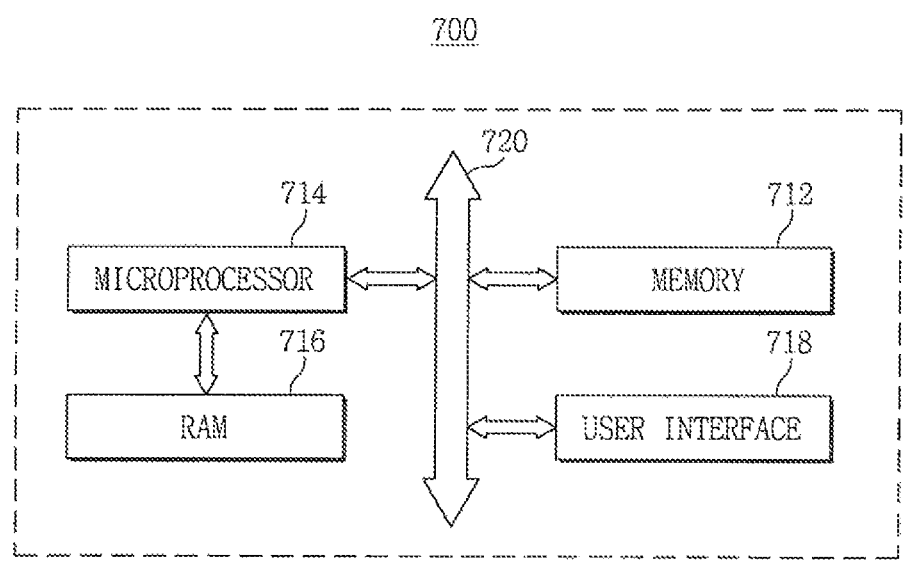

FIG. 20 is a block diagram conceptually illustrating an electronic system including the semiconductor device 100a, 100b, 100c, or 100d fabricated in accordance with various embodiments of the inventive concept.

Referring to FIG. 20, an electronic system 700 may include the semiconductor device 100a, 100b, 100c, or 100d fabricated in accordance with the embodiments of the inventive concept.

The electronic system 700 may be applied to a mobile electronic apparatus or a computer. For example, the electronic system 700 may include a memory system 712, a microprocessor 714, a random access memory (RAM) 716, and a user interface 718 which performs data communication using a bus 720. The microprocessor 714 may program and control the electronic system 700. The RAM 716 may be used as an operational memory of the microprocessor 714. For example, the microprocessor 714 or the RAM 716 may include one of the semiconductor devices 100a, 100b, 100c, and 100d fabricated in accordance with the embodiments of the inventive concept.

The microprocessor 714, the RAM 716, and/or other components may be assembled in a single package. The user interface 718 may be used to input data to or output data from the electronic system 700. The memory system 712 may store codes for operating the microprocessor 714, data processed by the microprocessor 714, or external input data. The memory system 712 may include a controller and a memory device.

As set forth above, a semiconductor device according to various embodiments of the inventive concept may include a crystal growth source/drain having a left-right asymmetric shape.

Due to the asymmetric shape of the source/drain, a contact area of the source/drain can be further secured, and thus on-current characteristics of the semiconductor device can be improved.

Other devices, methods, and/or systems according to embodiments of present inventive concepts will be or become apparent to one with skill in the art upon review of the drawings and detailed description. It is intended that all such additional devices and/or systems be included within this description, be within the scope of present inventive concepts, and be protected by the accompanying claims. Moreover, it is intended that all embodiments disclosed herein can be implemented separately or combined in any way and/or combination.

In the drawings and specification, there have been disclosed typical embodiments and, although specific terms are employed, they are used in a generic and descriptive sense only and not for purposes of limitation. The foregoing was for illustration of the embodiments only and is not to be construed as limiting thereof. Although a few embodiments have been described, those skilled in the art will readily appreciate that many modifications are possible without materially departing from the novel teachings, advantages and scope of the inventive concept as defined by the following claims.

What is claimed is:

1. A semiconductor device, comprising:
a substrate;
active fins that protrude from the substrate and include first fin areas and recessed second fin areas;
gate stacks that cross the first fin areas;
spacers on side surfaces of the gate stacks;
a device isolation layer that covers lower portions of the active fins; and
asymmetric source/drains disposed on the second fin areas,
wherein each source/drain comprises a first crystal growth portion and a second crystal growth portion that shares a plane with the first crystal growth portion and that has a lower surface at a lower level than a lower surface of the first crystal growth portion.

2. The semiconductor device of claim 1, further comprising:
a first residue between the first crystal growth portion and the device isolation layer; and
a second residue between the second crystal growth portion and the device isolation layer,
wherein the first residue and the second residue comprise a same material as the spacers.

3. The semiconductor device of claim 2, wherein an upper surface of the first residue is at the same level as or a higher level than upper surfaces of the active fins, and
an upper surface of the second residue is at a lower level than the upper surface of the first residue.

4. The semiconductor device of claim 3, wherein an upper surface of the device isolation layer that contacts the first residue and an upper surface of the device isolation layer that contacts the second residue are at the same level.

5. The semiconductor device of claim 4, wherein a lower surface of the second crystal growth portion contacts the upper surface of the second residue and a side surface of the active fin, and a lower surface of the first crystal growth portion contacts the upper surface of the first residue and the upper surface of the active fin.

6. The semiconductor device of claim 4, wherein each recessed second fin area comprises a recessed upper surface and a recessed side surface perpendicular to the recessed upper surface.

7. The semiconductor device of claim 6, wherein the first crystal growth portion of the source/drain contacts the recessed upper surface and the recessed side surface of each recessed second fin area.

8. The semiconductor device of claim 1, wherein the device isolation layer comprises a first region and a second region,
wherein the first region is disposed between the active fins,
wherein a width of the second region is greater than a width of the first region, and
wherein the second crystal growth portion overlaps the second region.

9. The semiconductor device of claim 8, wherein the second crystal growth portion does not overlap the first region.

10. A semiconductor device, comprising:
a substrate;
active fins that protrude from the substrate; and
a source/drain that contacts at least two of the active fins at the same time and that has a merged double-diamond shape,
wherein the source/drain comprises first crystal growth portions that contact upper surfaces of the at least two of the active fins, second crystal growth portions that share at least one plane with the first crystal growth portions and that contact side surfaces of the at least two of the active fins, and a third crystal growth portion formed to merge adjacent edges of the first crystal growth portions.

11. The semiconductor device of claim 10, wherein the second crystal growth portions contact opposite side surfaces of adjacent active fins.

12. The semiconductor device of claim 11, wherein the third crystal growth portions are between the at least two of the active fins and vertically aligned thereto.

13. The semiconductor device of claim 10, wherein the active fins comprises first upper surfaces contacting the source/drain, and second upper surfaces at a higher level than the first upper surfaces.

14. The semiconductor device of claim 10, wherein lower surfaces of the first crystal growth portions are at a higher level than lower surfaces of the second crystal growth portions, and at a lower level than lower surfaces of the third crystal growth portions.

15. A semiconductor device, comprising:
a substrate;
an active fin that protrudes from the substrate; and
a diamond-shaped source/drain on an upper surface of the active fin,
wherein the diamond-shaped source/drain comprises a first crystal growth portion and a second crystal growth portion, and wherein the second crystal growth portion comprises a lower surface that is at a lower level than a lower surface of the first crystal growth portion.

16. The semiconductor device of claim 15, further comprising:
   a device isolation layer adjacent the active fin;
   a first residue between the first crystal growth portion and the device isolation layer; and
   a second residue between the second crystal growth portion and the device isolation layer,
   wherein an upper surface of the first residue is at a same level as or at a higher level than an upper surface of the active fin, and
   wherein an upper surface of the second residue is at a lower level than the upper surface of the first residue and/or the active fin.

17. The semiconductor device of claim 16, wherein the active fin comprises a first active fin, and wherein the diamond-shaped source/drain comprises a first diamond-shaped source/drain, the semiconductor device further comprising:
   a second active fin that protrudes from the substrate and that is spaced apart from the first active fin by the device isolation layer;
   a second diamond-shaped source/drain on an upper surface of the second active fin, the second diamond-shaped source/drain comprising a third crystal growth portion and a fourth crystal growth portion, wherein the fourth crystal growth portion comprises a lower surface at a lower level than a lower surface of the third crystal growth portion;
   a merging crystal growth that connects the first crystal grown portion of the first diamond-shaped source/drain and the third crystal growth portion of the second diamond-shaped source/drain.

18. The semiconductor device of claim 17,
   wherein the merging crystal growth is remote from the second crystal growth portion of the first diamond-shaped source/drain, and
   wherein the merging crystal growth is remote from the fourth crystal growth portion of the second diamond-shaped source/drain.

19. The semiconductor device of claim 17,
   wherein dopant concentration of the first diamond-shaped source/drain gradually increases towards an upper end of the first diamond-shaped source/drain.

20. The semiconductor device of claim 17, further comprising:
   a gate stack comprising a gate dielectric layer and a gate electrode;
   a spacer electrically isolating the gate stack from the first diamond-shaped source/drain and the second diamond-shaped source/drain;
   a contact electrode adjacent the spacer, the contact electrode in direct contact with the first diamond-shaped source/drain, the second diamond-shaped source/drain, and the merging crystal growth.

* * * * *